United States Patent [19]
Urata et al.

[11] Patent Number: 6,088,272
[45] Date of Patent: Jul. 11, 2000

[54] DATA OUTPUT SYSTEM

[75] Inventors: Ichiro Urata; Satoru Yoshii; Osamu Ishikawa; Toshikazu Ito; Kazuya Yamamoto; Satoshi Yamamoto; Yoshikazu Endo, all of Tokyo, Japan

[73] Assignee: Oki Data Corporation, Tokyo, Japan

[21] Appl. No.: 09/177,078

[22] Filed: Oct. 23, 1998

[30] Foreign Application Priority Data

Oct. 24, 1997 [JP] Japan .................................. 9-292657
Nov. 12, 1997 [JP] Japan .................................. 9-327013

[51] Int. Cl.$^7$ ...................................................... G11C 7/00
[52] U.S. Cl. ..................................... 365/194; 365/189.05
[58] Field of Search .............................. 365/194, 189.05, 365/233.5; 395/556; 326/26

[56] References Cited

U.S. PATENT DOCUMENTS

| | | | |
|---|---|---|---|
| 5,572,145 | 11/1996 | Kinsella | ...................................... 326/26 |
| 5,615,358 | 3/1997 | Vogley | ...................................... 395/556 |
| 5,764,591 | 6/1998 | Matsui et al. | ........................... 365/194 |

*Primary Examiner*—David Nelms
*Assistant Examiner*—David Lam
*Attorney, Agent, or Firm*—Rabin & Champagne, P.C.

[57] ABSTRACT

A memory system includes a plurality of output buffers each of which outputs one of a plurality of one-bit signals forming data. The output buffers are put into a plurality of buffer groups. The memory system further includes a controller for feeding timing signals to the corresponding buffer groups via delay circuits having mutually different time constants, respectively. The timing signals include certain timing which causes the output buffers to output the corresponding one-bit signals. Since the foregoing certain timing is delayed depending on the time constants of the delay circuits, although the output buffers in the same buffer group output the corresponding one-bit signals simultaneously, the output buffers in the different buffer groups output the corresponding one-bit signals with mutually different timing.

13 Claims, 20 Drawing Sheets

DATA OUTPUT SYSTEM

BACKGROUND OF THE INVENTION

1. Field of the Invention

The present invention relates to a memory system including a memory and a controller controlling the memory and, in particular, to a technique for controlling a plurality of buffers of the memory which output data.

2. Description of the Prior Art

In a memory system, for reading out data stored at a certain address in a memory such as a DRAM (dynamic random access memory), a controller identifies the address by first designating a row address and then a column address. In response, the DRAM outputs the data stored at the identified address.

More specifically, the controller designates a row address to the DRAM by outputting it onto an address bus and then asserting a row address strobe signal line. Subsequently, the controller designates a column address to the DRAM by outputting it onto the address bus and then asserting a column address strobe signal line. When a target address is identified by asserting the column address strobe signal line, the DRAM outputs data stored in cells corresponding to the identified address via output buffers. For example, 32-bit data is outputted via 32 output buffers.

However, in the conventional memory system, the controller designates the column address at one time by asserting the column address strobe signal line. Accordingly, the DRAM outputs the 32-bit data stored at the address identified upon designation of the column address via the 32 output buffers at one time. This causes the current to flow through all the 32 output buffers simultaneously. In this event, a large amount of the current flows instantaneously so that a power supply voltage or a ground potential may fluctuate. This may render an operation of the DRAM unstable and cause an occurrence of EMI (electromagnetic interference).

SUMMARY OF THE INVENTION

Therefore, it is an object of the present invention to provide an improved data output system.

It is another object of the present invention to provide an improved data storing system.

It is another object of the present invention to provide an improved data output method.

According to one aspect of the present invention, there is provided a data output system comprising a plurality of buffers each outputting one of a plurality of one-bit signals that form data, wherein at least one of the buffers outputs the corresponding one-bit signal at a time different from a time when at least another of the buffers outputs the corresponding one-bit signal.

It may be arranged that the buffers output the corresponding one-bit signals at mutually different times, respectively.

It may be arranged that the buffers are put into a plurality of buffer groups each including at least one of the buffers and that the buffers output the corresponding one-bit signals at mutually different times among the buffer groups.

It may be arranged that the data output system further comprises a control device for feeding timing signals to the buffer groups at mutually different times, each of the timing signals causing the at least one of the buffers in the corresponding buffer group to output the corresponding one-bit signal.

It may be arranged that the control device comprises a control circuit for outputting the timing signals simultaneously; and a plurality of time adjusting circuits for delaying the timing signals with mutually different time lags.

It may be arranged that the time adjusting circuits include integrating circuits, respectively, the integrating circuits having mutually different time constants.

According to another aspect of the present invention, there is provided a data storing system comprising a storage device storing data; a plurality of output buffers each outputting one of a plurality of one-bit signals which form the data inputted from the storage device; and a control device for outputting a plurality of timing signals for causing at least one of the output buffers to output the corresponding one-bit signal at a first time and for causing at least another of the output buffers to output the corresponding one-bit signal at a second time, the first and second times being different from each other.

It may be arranged that the control device comprises a control circuit for outputting the timing signals simultaneously; and a plurality of time adjusting circuits for delaying the timing signals with mutually different time lags.

It may be arranged that each of the time adjusting circuits comprises a corresponding one of integrating circuits having mutually different time constants.

It may be arranged that each of the integrating circuits comprises a corresponding one of resistors having mutually different resistance values; and an input capacitance of a corresponding one of input terminals of the storage device, the input terminals receiving the timing signals, respectively.

It may be arranged that each of the integrating circuits comprises a corresponding one of resistors having mutually different resistance values; an input capacitance of a corresponding one of input terminals of the storage device, the input terminals receiving the timing signals, respectively; and a capacitor connected in parallel to the input capacitance.

It may be arranged that each of the time adjusting circuits further comprises a buffer for electrically separating the integrating circuit from an input capacitance of a corresponding one of input terminals of the storage device, the input terminals receiving the timing signals, respectively.

It may be arranged that each of the integrating circuits comprises a first integrating section including a first resistor and a capacitor; a second integrating section including a second resistor and an input capacitance of a corresponding one of input terminals of the storage device, the input terminals receiving the timing signals, respectively; and a buffer for electrically separating the first and second integrating sections from each other.

It may be arranged that the second integrating section further comprises a capacitor connected in parallel to the input capacitance.

It may be arranged that output buffers are provided in the storage device.

It may be arranged that the storage device comprises a first and a second storing circuit for sharing the data, and that at least one of the output buffers is provided in the first storing circuit and at least another of the output buffers is provided in the second storing circuit.

It may be arranged that the timing signals represent times when the storage device inputs the data into the output buffers.

It may be arranged that the timing signals represent times when the output buffers output the corresponding one-bit signals, respectively.

It may be arranged that the resistance values of the resistors are set based on the corresponding input capacitance, respectively.

It may be arranged that the resistance values of the resistors are set to be smaller as the corresponding input capacitance increase.

It may be arranged that the data storing system further comprises another storage device storing other data of lower access frequency as compared with the aforementioned data, and outputting the other data; and data output lines shared by the output buffers and the other storage device, wherein the aforementioned data and the other data are selectively outputted onto the data output lines.

It may be arranged that the storage device comprises a storing circuit in which the data is identified using a first and a second address, and that the timing signals are used for designating the first and second addresses.

According to another aspect of the present invention, there is provided a method of outputting data from a plurality of buffers each outputting one of a plurality of one-bit signals which form the data, the method comprising the step of staggering a time when at least one of the buffers outputs the corresponding one-bit signal and a time when at least another of the buffers outputs the corresponding one-bit signal.

According to another aspect of the present invention, there is provided a method of outputting data from a plurality of buffers each outputting one of a plurality of one-bit signals which form the data, the data identified by an address from among a plurality of data stored in a storage device, the method comprising the step of staggering times of designating the address among the one-bit signals.

According to another aspect of the present invention, there is provided a method of outputting data from a plurality of buffers each outputting one of a plurality of one-bit signals, which form the data, in response to corresponding one of a plurality of timing signals, the method comprising the steps of inputting, at a first time, one of the timing signals into at least one of the buffers; and inputting, at a second time different from the first time, another of the timing signals into at least another of the buffers.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, the preferred embodiments of the present invention will be described hereinbelow with reference to the accompanying drawings.

First Embodiment

Figure 1:
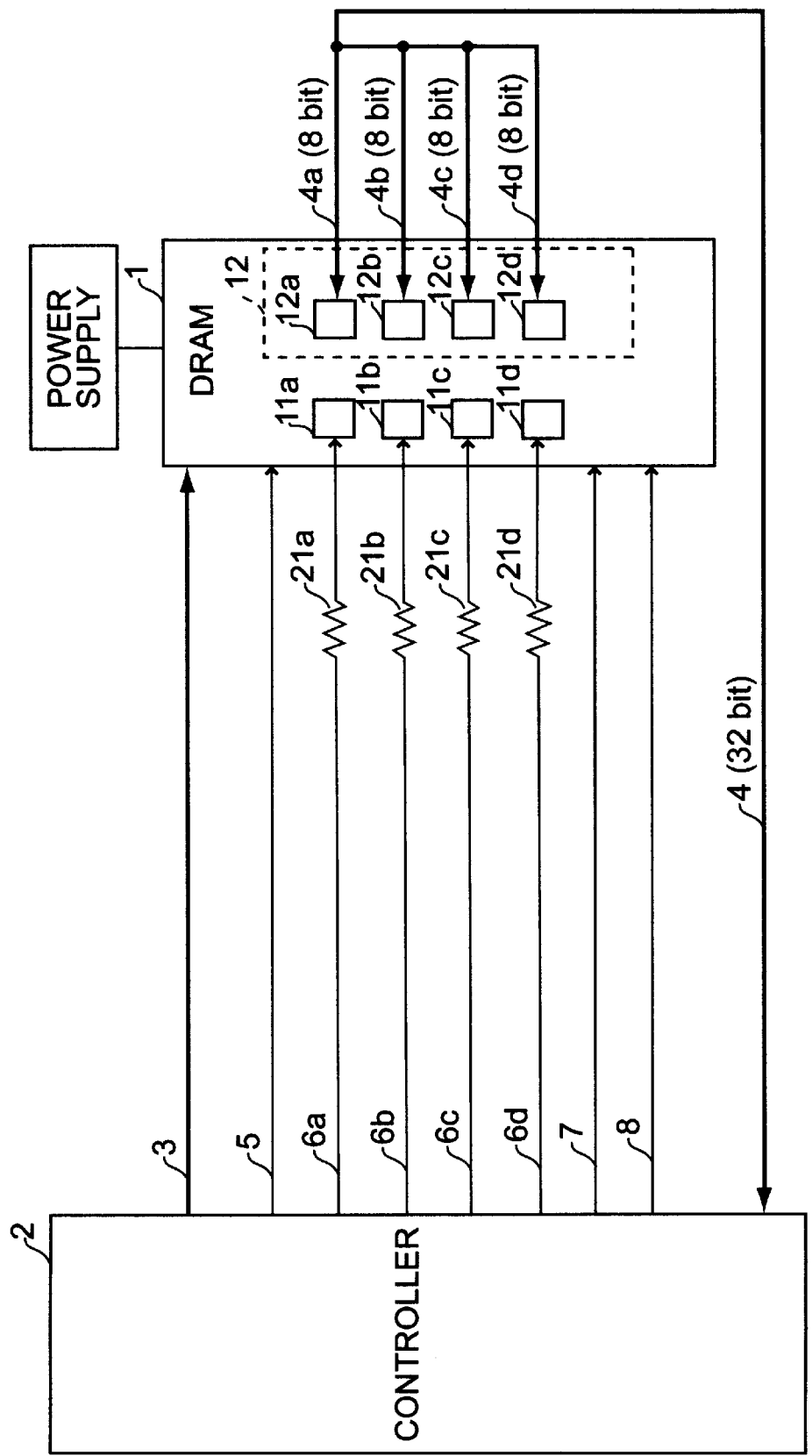
FIG. 1 is a block diagram showing a structure of a memory system according to a first preferred embodiment of the present invention.

FIG. 1 is a block diagram showing a structure of a memory system according to the first preferred embodiment of the present invention.

As shown in FIG. 1, the memory system comprises a DRAM 1 and a controller 2 for controlling an operation of the DRAM 1.

The DRAM 1 and the controller 2 are connected to each other via an address bus 3, a data bus 4, a row address strobe (hereinafter referred to as "RAS") signal line 5, column address strobe (hereinafter referred to as "CAS") signal lines 6a to 6d, a read signal line 7 and a write signal line 8.

The address bus 3 is a one-way bus for sending a row address and a column address of the DRAM 1, designated by the controller 2, to the DRAM 1.

The data bus 4 is a two-way bus for sending and receiving data between the DRAM 1 and the controller 2 and is composed of 32-bit data lines. The 32-bit data lines are grouped every 8 bits so as to provide data line groups 4a, 4b, 4c and 4d.

Each of the RAS signal line 5, the CAS signal lines 6a to 6d, the read signal line 7 and the write signal line 8 is a one-way control signal line for sending a control signal of the controller 2 to the DRAM 1.

Each of the address bus 3 and the data bus 4 is a signal line wherein a high signal level and a low signal level both have respective meanings.

Each of the RAS signal line 5, the CAS signal lines 6a to 6d, the read signal line 7 and the write signal line 8 is a negative-true logic signal line which represents an active state when a signal level is low.

The controller 2 outputs a row address and a column address, in turn, of the DRAM 1 onto the address bus 3, and controls the states of control signals of the respective control signal lines so as to read out or write data of 32 bits at maximum from and into the DRAM 1.

The RAS signal line 5 sends a RAS signal of the controller 2 to the DRAM 1. When the RAS signal is asserted, i.e. switched to a low level, by the controller 2, the DRAM 1 latches a row address outputted onto the address bus 3 by the controller 2 and chooses a word line of a memory cell array (not shown) corresponding to the row address.

Each of the CAS signal lines 6a to 6d sends a CAS signal of the controller 2. By means of these four CAS signal lines, data of 32 bits at maximum of the memory cell array of the DRAM 1 is chosen. Among the 32 bits, the CAS signal line 6a corresponds to the most significant 8 bits, the CAS signal line 6b to 8 less significant bits, the CAS signal line 6c to 8 further less significant bits, and the CAS signal line 6d to the least significant 8 bits.

The controller 2 outputs a column address representing 8-bit data, 16-bit data, 24-bit data or 32-bit data, chooses one to four of the CAS signal lines 6a to 6d corresponding to the outputted column address, and asserts a CAS signal/CAS signals of the chosen CAS signal line/lines. When a plurality of the CAS signal lines are chosen, the controller 2 asserts the CAS signals thereof simultaneously.

When the CAS signals of the chosen CAS signal lines are asserted by the controller 2, the DRAM 1 latches the column address outputted onto the address bus 3 by the controller 2 and chooses data corresponding to the column address.

The CAS signal line 6a has a resistor 21a having a resistance value Ra and connected in series, the CAS signal line 6b has a resistor 21b having a resistance value Rb and connected in series, the CAS signal line 6c has a resistor 21c having a resistance value Rc and connected in series, and the CAS signal line 6d has a resistor 21d having a resistance value Rd and connected in series. It is set that Ra<Rb<Rc<Rd.

The read signal line 7 sends a read signal of the controller 2 to the DRAM 1. The read signal is a control signal indicative of reading out data from the DRAM 1.

The write signal line 8 sends a write signal of the controller 2 to the DRAM 1. The write signal is a control signal indicative of writing data into the DRAM 1.

The DRAM 1 is provided with input buffers 11a to 11d connected to the CAS signal lines 6a to 6d, respectively.

Since the input buffers 11a to 11d have the same structures, only the input buffer 11a will be explained hereinbelow for brevity of description.

Figure 2:
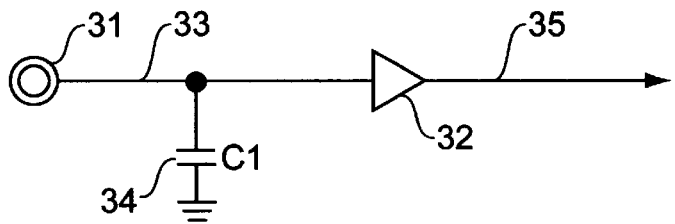
FIG. 2 is a diagram showing an equivalent circuit of one of input buffers shown in FIG. 1.

FIG. 2 is a diagram showing an equivalent circuit of the input buffer 11a.

As shown in FIG. 2, the input buffer 11a amplifies, at a buffer 32, a CAS signal inputted via an input terminal 31 and outputs it to an internal circuit (not shown) of the DRAM 1. The input buffer 11a includes a capacitor 34 having one end connected to an input line 33 of the buffer 32 and the other end grounded. The capacitor 34 equivalently represents a stray capacitance C1 between the input line 33 and the ground (zero potential line). The CAS signal amplified at the buffer 32 is outputted to the foregoing internal circuit of the DRAM 1 via an output line 35.

The resistor 21a of the CAS signal line 6a and the capacitor 34 of the input buffer 11a constitute a time constant circuit. A time constant ta thereof is given by the product of the resistance value Ra of the resistor 21a and the capacitance C1 of the capacitor 34.

The assert timing at which the CAS signal of the CAS signal line 6a is actually lowered is delayed depending on the time constant ta.

Similarly, the resistor 21b of the CAS signal line 6b and the input buffer 11b constitute a time constant circuit having a time constant tb (=Rb×C1), the resistor 21c of the CAS signal line 6c and the input buffer 11c constitute a time constant circuit having a time constant tc (=Rc×C1), and the resistor 21d of the CAS signal line 6d and the input buffer 11d constitute a time constant circuit having a time constant td (=Rd×C1).

Specifically, the CAS signal lines 6a to 6d have the time constants ta, tb, tc and td, respectively. It is set that ta<tb<tc<td.

The DRAM 1 is further provided with a data input/output buffer unit 12 connected to the data bus 4.

The data input/output buffer unit 12 comprises data input/output buffer groups 12a to 12d.

The data input/output buffer groups 12a to 12d correspond to the input buffers 11a to 11d, respectively, and further correspond to the data line groups 4a to 4d, respectively.

Since the data input/output buffer groups 12a to 12d have the same structures, only the data input/output buffer group 12a will be explained hereinbelow for brevity of description.

The data input/output buffer group 12a includes eight pairs of data input buffers and data output buffers. Each pair of the data input buffer and the data output buffer is connected to one of the data lines forming the data line group 4a.

When a RAS signal and a read signal inputted into the DRAM 1 are asserted and then a CAS signal inputted into the input buffer 11a is asserted, the data output buffers are activated to receive data of memory cells chosen based on a row address and a column address and output them onto the corresponding data lines of the data line group 4a.

Similarly, when a RAS signal and a write signal inputted into the DRAM 1 are asserted and then a CAS signal inputted into the input buffer 11a is asserted, the data input buffers are activated to receive data from the corresponding data lines of the data line group 4a and write them into memory cells chosen based on a row address and a column address.

Now, an operation of the memory system shown in FIGS. 1 and 2 will be described. It is assumed that the controller 2 reads out or writes 32-bit data from or into the DRAM 1.

An operation of reading out data from the DRAM 1 will be first described.

First, the controller 2 outputs a row address onto the address bus 3 and then asserts a RAS signal of the RAS signal line 5. The DRAM 1 latches, synchronously with the assert timing of the RAS signal, the row address outputted onto the address bus 3 by the controller 2 and then chooses a word line of a memory cell array corresponding to the row address.

Then, the controller 2 asserts a read signal of the read signal line 7 so that a read mode is set in the DRAM 1.

Then, the controller 2 outputs a column address onto the address bus 3 and asserts CAS signals of the CAS signal lines 6a to 6d simultaneously. The DRAM 1 latches, synchronously with the assert timings of the respective CAS signals, corresponding portions of the column address and outputs 32-bit cell data, stored in memory cells on the chosen word line corresponding to the column address, onto the data bus 4 via the data output buffers of the data input/output buffer unit 12. The data outputted onto the data bus 4 is taken into the controller 2.

Now, an operation of writing data into the DRAM 1 will be described.

First, the controller 2 outputs a row address onto the address bus 3 and then asserts a RAS signal of the RAS signal line 5. The DRAM 1 latches, synchronously with the assert timing of the RAS signal, the row address outputted onto the address bus 3 by the controller 2 and then chooses a word line of a memory cell array corresponding to the row address.

Then, the controller 2 asserts a write signal of the write signal line 8 and outputs data onto the data bus 4.

Then, the controller 2 outputs a column address onto the address bus 3 and asserts CAS signals of the CAS signal lines 6a to 6d simultaneously. The DRAM 1 latches, synchronously with the assert timings of the respective CAS signals, corresponding portions of the column address. Then, the data outputted onto the data bus 4 by the controller 2 is taken into the corresponding data input buffers of the data input/output buffer unit 12 and then written into memory cells on the chosen word line corresponding to the column address.

Figure 3:
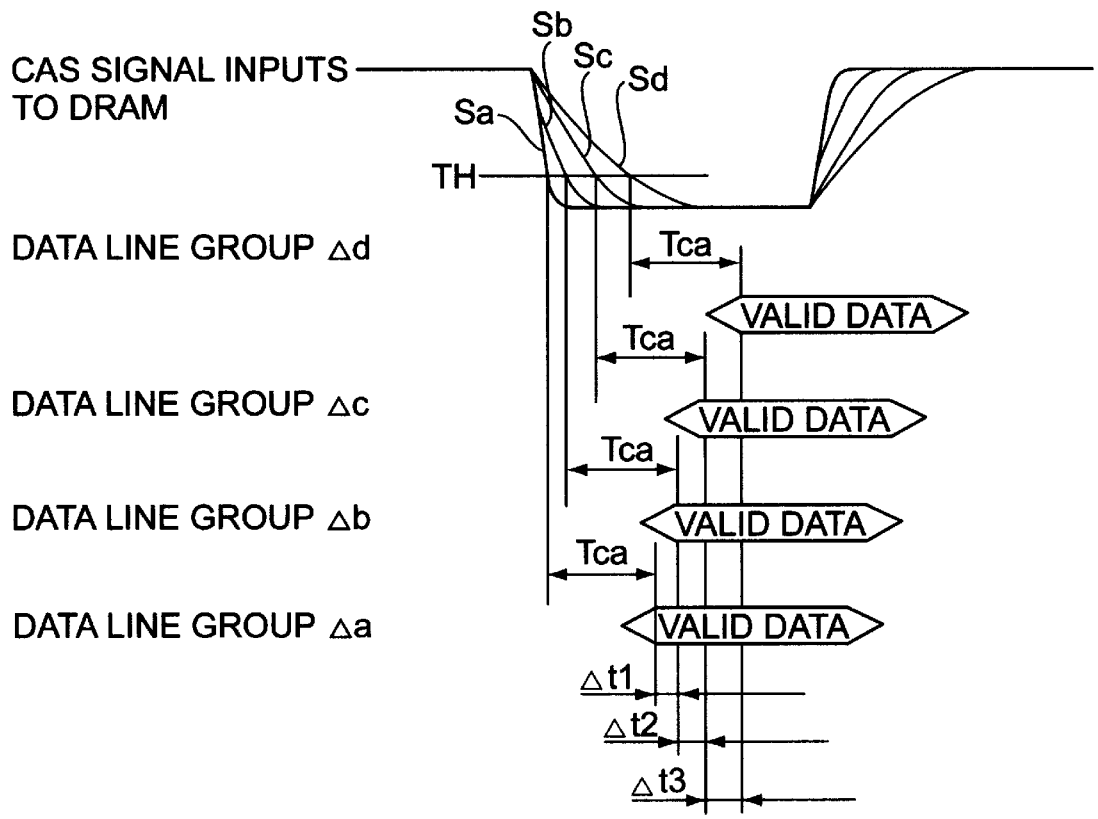
FIG. 3 is a diagram showing the assert timings of CAS signals in the memory system shown in FIGS. 1 and 2.

FIG. 3 is a diagram showing the assert timings of the CAS signals in the memory system shown in FIGS. 1 and 2.

In FIG. 3, when, for example, the controller 2 asserts a CAS signal Sa of the CAS signal line 6a, the CAS signal Sa is lowered with a delay corresponding to the time constant ta of the time constant circuit composed of the resistor 21a and the input buffer 11a. The DRAM 1 recognizes the lowering of the CAS signal Sa when the level of the CAS signal Sa becomes smaller than a threshold value TH. Upon recognizing the lowering of the CAS signal Sa, the DRAM 1 starts reading out data from a corresponding portion of the column address and outputs the data into the data line group 4a after a lapse of access time Tca.

As described before, the CAS signal lines 6a to 6d have the time constants ta, tb, tc and td, respectively, wherein ta<tb<tc<td.

When the controller 2 asserts CAS signals Sa, Sb, Sc and Sd of the CAS signal lines 6a, 6b, 6c and 6d simultaneously, the CAS signals Sa, Sb, Sc and Sd are lowered in level so as to be smaller than the threshold value TH in the order named. Accordingly, the DRAM 1 recognizes the lowering of the CAS signals Sa, Sb, Sc and Sd in the order named.

Specifically, the DRAM 1 recognizes the lowering of the CAS signal Sb after a lapse of Dt1 from the lowering of the CAS signal Sa, the lowering of the CAS signal Sc after a lapse of Dt2 from the lowering of the CAS signal Sb, and the lowering of the CAS signal Sd after a lapse of Dt3 from the lowering of the CAS signal Sc.

As a result, data is outputted into the data line group 4b after a lapse of Dt1 from a data output into the data line group 4a, data is outputted into the data line group 4c after a lapse of Dt2 from the data output into the data line group 4b, and data is outputted into the data line group 4d after a lapse of Dt3 from the data output into the data line group 4c.

The data outputted into the data line groups 4a to 4d are taken into the controller 2 simultaneously at a certain timing while all the data are valid.

Since the assert timings of the CAS signals Sa, Sb, Sc and Sd are also delayed in the same manner at the time of data writing, data outputted onto the data bus 4 by the controller 2 are inputted into the DRAM 1 via the data line groups 4a to 4d with time delays in the order named.

As described above, according to this embodiment, the CAS signal lines 6a to 6d are provided with the resistors 21a to 21d having the different resistance values and, in cooperation with the input terminal stray capacitance C1 of the corresponding input buffers 11a to 11d, the assert timings of the CAS signals Sa to Sd simultaneously asserted by the controller 2 are staggered, so that the input/output timings of data into/from the data input/output buffer groups 12a to 12d are staggered.

Therefore, since abrupt changes of current, which would be otherwise generated at a power supply line and a ground line on a substrate upon inputting/outputting data between the data input/output buffers and the data bus, can be dispersed in terms of time so as to be smaller, the fluctuation of potentials at the power supply line and the ground line which would otherwise follow the abrupt changes of current can be reduced. Thus, a malfunction of the memory system as well as an occurrence of EMI can be avoided.

Further, since only the resistors having mutually different resistance values are required to be provided at the CAS signal lines, the memory system can be realized with a simple circuit structure.

Second Embodiment

Figure 4:
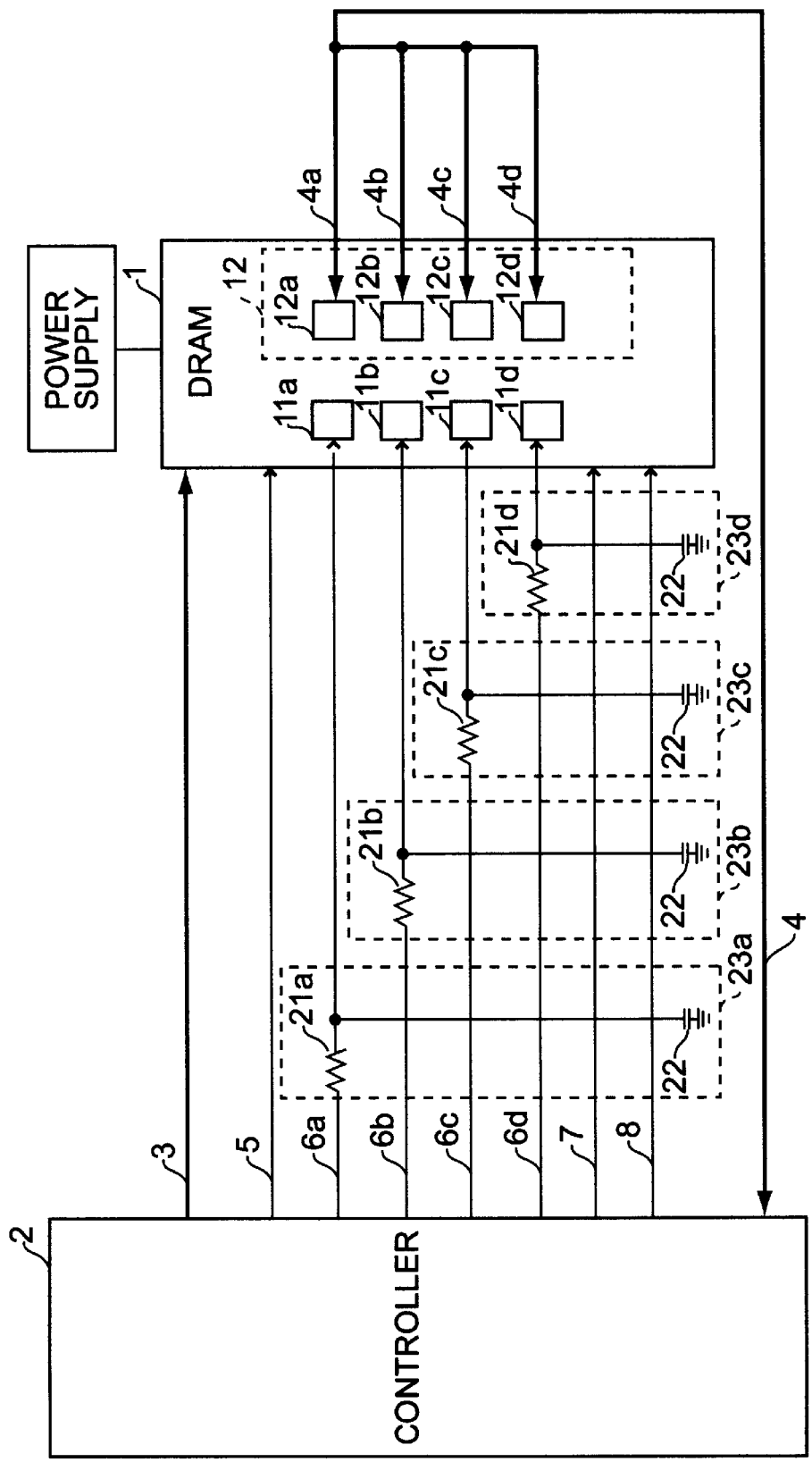
FIG. 4 is a block diagram showing a structure of a memory system according to a second preferred embodiment of the present invention.

FIG. 4 is a block diagram showing a structure of a memory system according to the second preferred embodiment of the present invention.

As shown in FIG. 4, the memory system in this embodiment is, as compared with the memory system according to the first preferred embodiment, further provided with capacitors 22 each having a capacitance C2. Specifically, the CAS signal lines 6a to 6d are provided with the capacitors 22 each having one end connected to the corresponding CAS signal line at an output side of corresponding one of the resistors 21a to 21d and the other end which is grounded.

The capacitor 22 of the CAS signal 6a constitutes a time constant circuit in cooperation with the resistor 21a and the input terminal stray capacitance C1 of the input buffer 11a. A time constant t2a of the circuit is given by $$t2a = Ra \times (C1+C2)$$

Similarly, a time constant circuit having a time constant $t2b$ (=$Rb \times (C1+C2)$) is provided at the CAS signal line 6b, a time constant circuit having a time constant $t2c$ (=$Rc \times (C1+C2)$) is provided at the CAS signal line 6c, and a time constant circuit having a time constant $t2d$ (=$Rd \times (C1+C2)$) is provided at the CAS signal line 6d.

For convenience of explaining the third and fourth preferred embodiments of the present invention later, a time constant circuit comprising the resistor 21a and the capacitor 22 of the CAS signal line 6a is represented by an RC circuit 23a, a time constant circuit comprising the resistor 21b and the capacitor 22 of the CAS signal line 6b is represented by an RC circuit 23b, a time constant circuit comprising the resistor 21c and the capacitor 22 of the CAS signal line 6c is represented by an RC circuit 23c, and a time constant circuit comprising the resistor 21d and the capacitor 22 of the CAS signal line 6d is represented by an RC circuit 23d.

Now, the memory system in this embodiment will be compared with the memory system in the first preferred embodiment.

In the memory system of the first preferred embodiment, the CAS signals Sa to Sd of the CAS signal lines 6a to 6d are delayed by the time constant circuits having the time constants given by $$ta = Ra \times C1$$

$$tb = Rb \times C1$$

$$tc = Rc \times C1$$

$$td = Rd \times C1$$

On the other hand, in the memory system of this embodiment, CAS signals S2a to S2d of the CAS signal lines 6a to 6d are delayed by the time constant circuits having the time constants given by $$t2a = Ra \times (C1 + C2)$$

$$t2b = Rb \times (C1 + C2)$$

$$t2c = Rc \times (C1 + C2)$$

$$t2d = Rd \times (C1 + C2)$$

It is clear that $$t2a > ta$$

$$t2b > tb$$

$$t2c > tc$$

$$t2d > td$$

Hence, the CAS signals S2a, S2b, S2c and S2d in this embodiment are more delayed as compared with the CAS signals Sa, Sb, Sc and Sd in the first preferred embodiment. As a result, it is established that $$t2b - t2a > tb - ta$$

$$t2c - t2b > tc - tb$$

$$t2d - t2c > td - tc$$

Hence, time lags between S2a and S2b, between S2b and S2c and between S2c and S2d are greater than time lags between Sa and Sb, between Sb and Sc and between Sc and Sd, respectively. Accordingly, the data input/output timings are staggered by greater amounts among the data input/output buffer groups 12a to 12d as compared with the first preferred embodiment.

As described above, according to this embodiment, the capacitors 22 are connected between the corresponding CAS signal lines 6a to 6d and the ground, respectively, so as to enlarge the time delay differences among the CAS signals S2a to S2d of the CAS signal lines 6a to 6d, thereby to increase offsets of the data input/output timings among the data input/output buffer groups 12a to 12d.

Accordingly, in this embodiment, current changes generated at the ground line on the substrate upon inputting/outputting data between the data input/output buffers and the data bus can be further dispersed in terms of time.

In the memory system of the first preferred embodiment, since the input terminal stray capacitance C1 of each of the input buffers 11a to 11d are small, the resistance values of the resistors, particularly the resistance value Rd of the resistor 21d should be set large. As a result, the impedance of the CAS signal line 6d is increased to deteriorate an anti-noise property.

On the other hand, in the memory system of this embodiment, the resistance values of the resistors 21a to 21d can be set small by setting large the capacitance values of the capacitors 22. Accordingly, impedance of the CAS signal lines 6a to 6d can be set small to improve the anti-noise property.

In this embodiment, each capacitor 22 is grounded at its one end. Alternatively, each capacitor 22 may be connected to a power supply at its one end.

Further, in this embodiment, the CAS signal lines 6a to 6d are provided with resistors 21a to 21d whose resistance values mutually differ from each other, and with the capacitors 22 of the same capacitance. Alternatively, the resistance values may be set equal to each other and the capacitance values may be set different from each other.

In sum, the resistance values of the resistors and the capacitance values of the capacitors of the CAS signal lines 6a to 6d may be set so as to increase time delay differences of the CAS signals among the CAS signal lines 6a to 6d.

Third Embodiment

Figure 5:
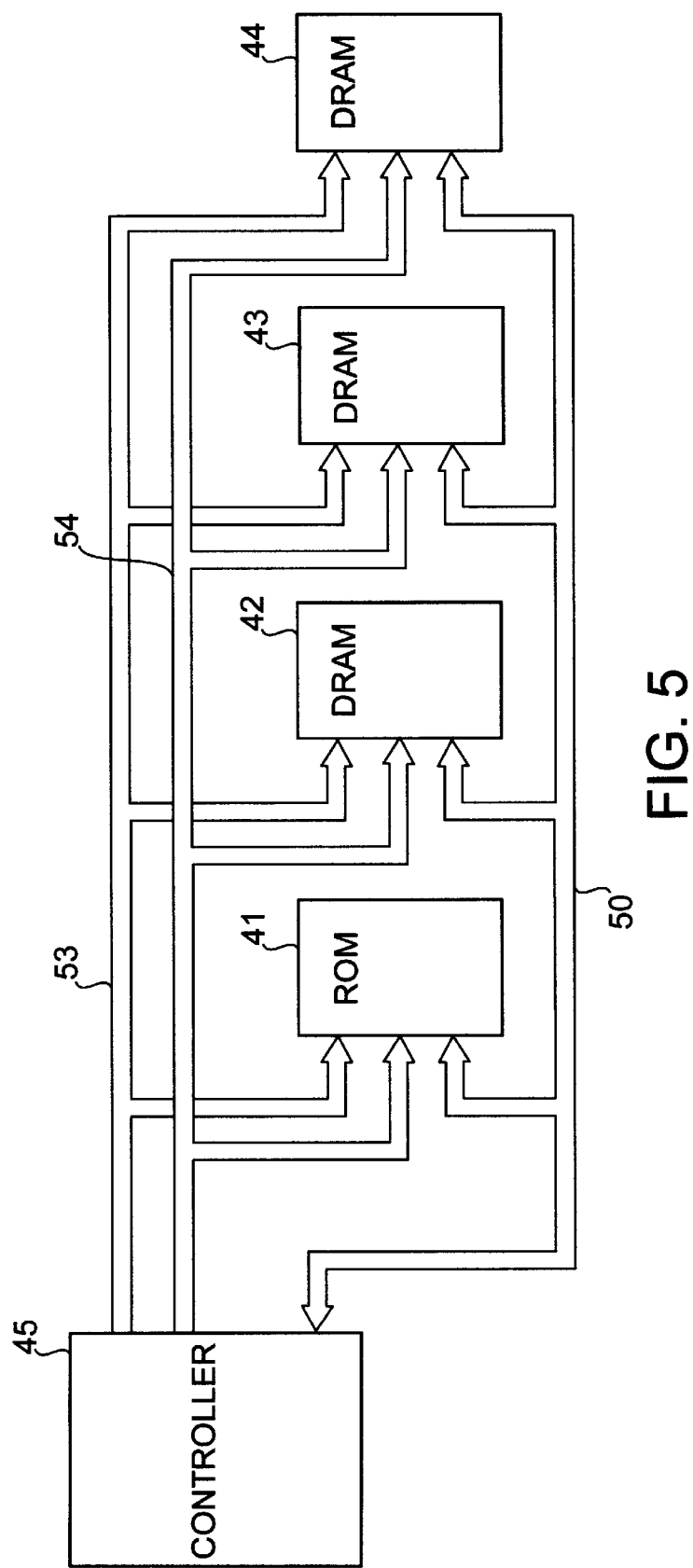
FIG. 5 is a block diagram showing a structure of a memory system according to a third preferred embodiment of the present invention.

FIG. 5 is a block diagram showing a structure of a memory system according to the third preferred embodiment of the present invention.

As shown in FIG. 5, the memory system comprises a ROM (read-only memory) 41, DRAM's 42, 43 and 44, and a controller 45 for controlling operations of these memories. The memories 41 to 44 and the controller 45 are connected to each other via an address bus 53, a data bus 54 and a control bus 50.

The ROM 41 and the DRAM 42 are standard memories of the memory system, while the DRAM's 43 and 44 are expansion memories optionally provided in the memory system and detachably mounted on a substrate (not shown).

The DRAM's 42 to 44 each have the same structure as the DRAM 1 shown in FIG. 1. The address bus 53 has the same structure as the address bus 3 shown in FIG. 1. Like the data bus 4 shown in FIG. 1, the data bus 54 is composed of 32-bit data lines which are grouped every 8 bits so as to form data line groups 54a to 54d (see FIG. 6).

Figure 6:
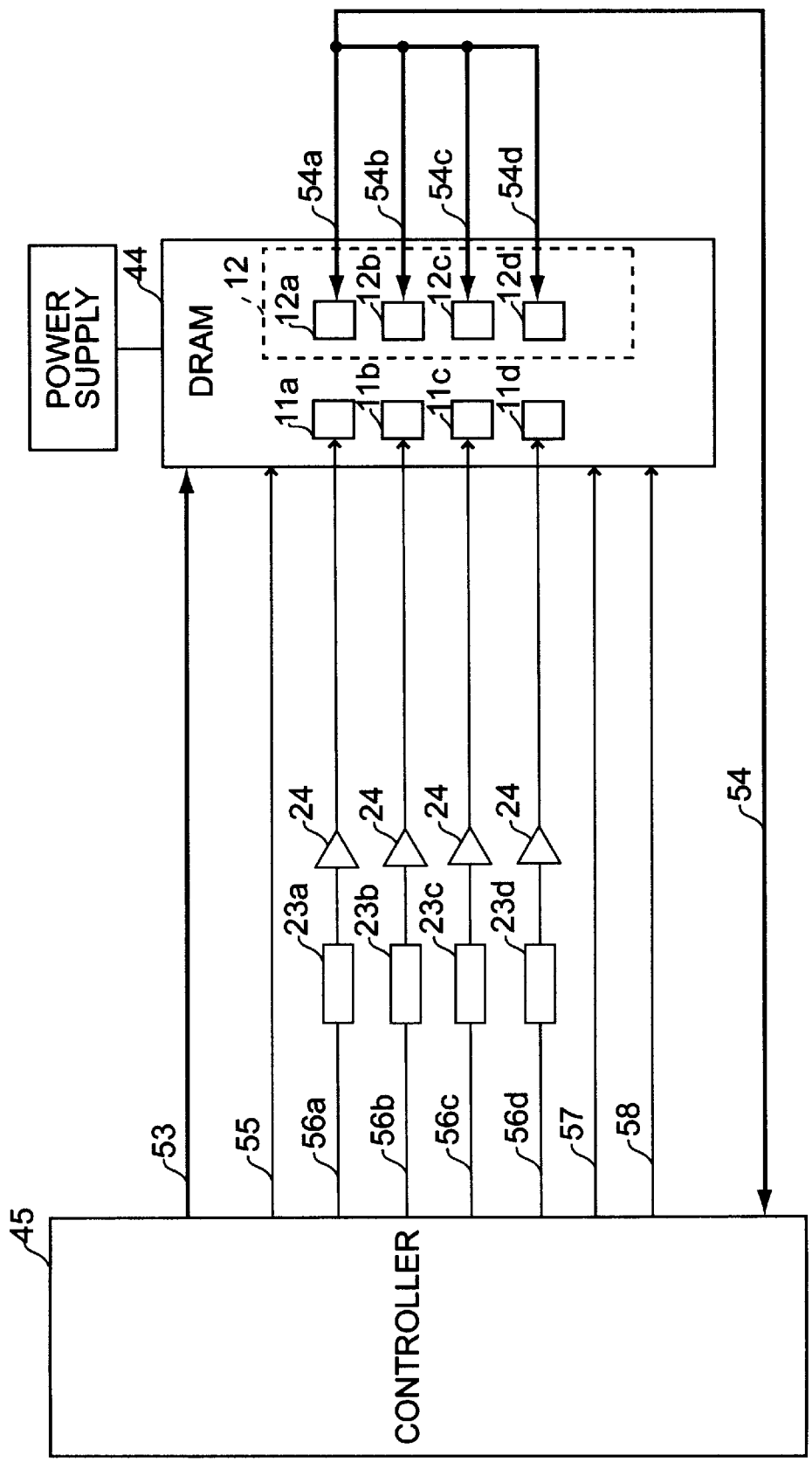
FIG. 6 is a block diagram showing the main part of the memory system shown in FIG. 5.

The control bus 50 comprises a RAS signal line 55, CAS signal lines 56a to 56d, a read signal line 57 and a write signal line 58 (see FIG. 6). The CAS signal lines 56a to 56d and the read signal line 57 are commonly connected to the ROM 41 and the DRAM's 42 to 44, while the write signal line 58 is commonly connected to the DRAM's 42 to 44.

FIG. 6 is a block diagram showing the main part of the memory system shown in FIG. 5.

As shown in FIG. 6, the CAS signal line 56a is provided with the RC circuit 23a shown in FIG. 4 and a buffer 24 for amplifying an output of the RC circuit 23a in the same phase.

Similarly, the CAS signal lines 56b to 56d are provided with the RC circuits 23b to 23d shown in FIG. 4 and buffers 24, respectively.

As described above, the DRAM's 43 and 44 shown in FIG. 5 are the optionally provided expansion memories, and the load capacitance of the CAS signal lines 56a to 56d change depending on whether or not the DRAM 43 and/or the DRAM 44 are/is provided.

For facilitating explanation, it is assumed that a load capacitance of each of the ROM 41 and the DRAM's 42 to 44 is set to C. In this case, if neither of the DRAM's 43 and 44 is provided, the load capacitance becomes (C×2). If either of the DRAM's 43 and 44 is provided, the load capacitance becomes (C×3). If the DRAM's 43 and 44 are both provided, the load capacitance becomes (C×4).

If the CAS signal lines 56a to 56d are not provided with the buffers 24, as in the first and second preferred embodiments, time constants of time constant circuits of the CAS signal lines 56a to 56d change depending on the presence or absence of the DRAM 43 and/or the DRAM 44.

For example, if neither of the DRAM's 43 and 44 is provided, a time constant of the CAS signal line 56a caused by the memory load capacitance is given by (Ra×2C) and, if the DRAM's 43 and 44 are both provided, it is given by (Ra×4C).

If the time constants of the CAS signal lines 56a to 56d change, the input/output timings of data into/from the data input/output buffer groups 12a to 12d also change.

Accordingly, the time constant circuits of the CAS signal lines 56a to 56d are designed on the basis of the case where the expansion DRAM's 43 and 44 are both provided to render the load capacitance maximum. Therefore, when neither of the DRAM's 43 and 44 is provided to render the load capacitance minimum, the time constants of the CAS signal lines 56a to 56d may become so small that the assert timings of the CAS signals can not be staggered sufficiently.

In the memory system of this embodiment, the CAS signal lines 56a to 56d are provided with the buffers 24 for amplifying the outputs of the RC circuits 23a to 23d, respectively, so that the change in load capacitance is prevented from influencing the time constants of the RC circuits 23a to 23d.

Figure 7:
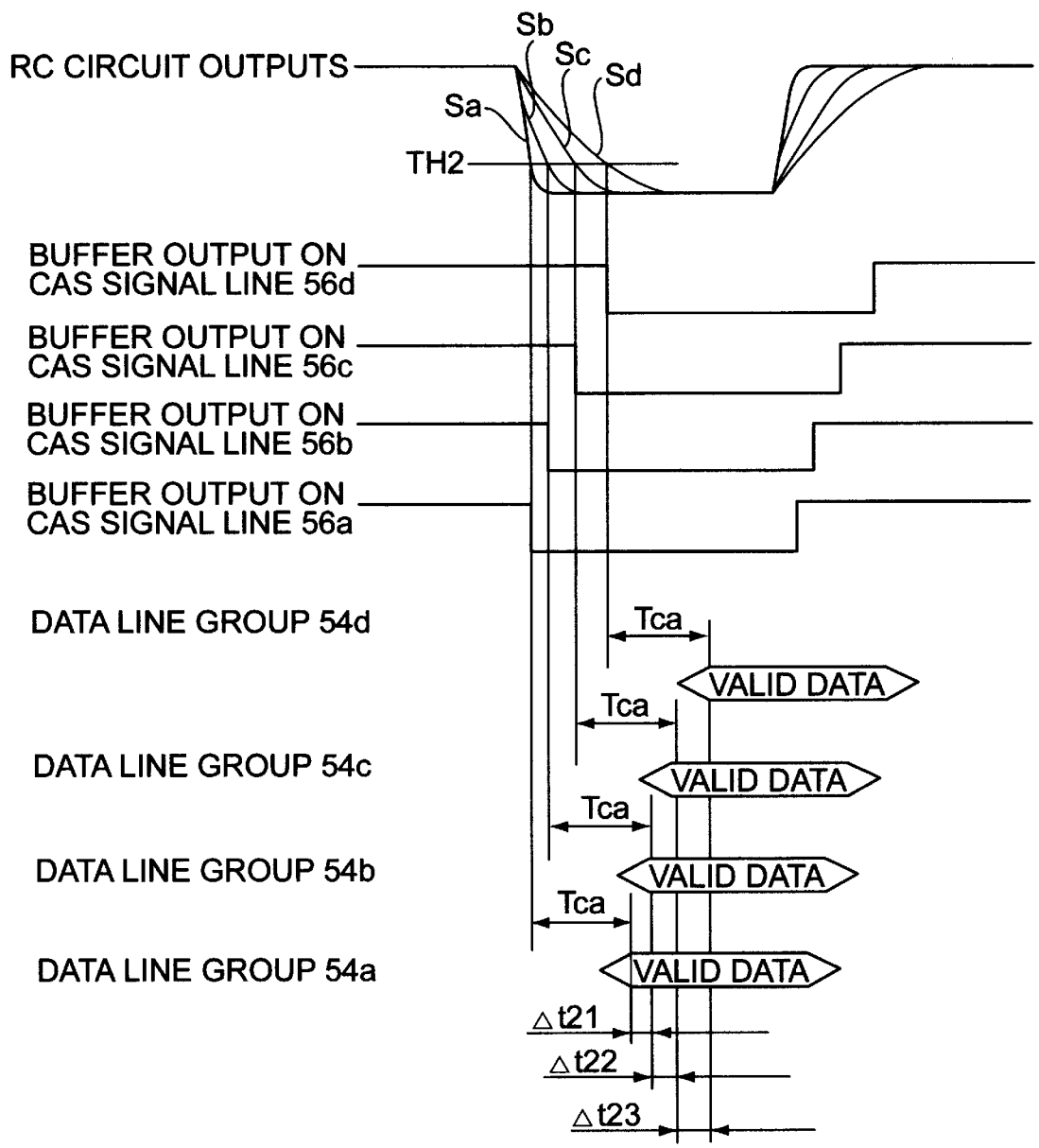
FIG. 7 is a diagram showing the assert timings of CAS signals in the memory system shown in FIGS. 5 and 6.

FIG. 7 is a diagram showing the assert timing of each of the CAS signals in the memory system according to this embodiment.

When, for example, the controller 45 asserts a CAS signal Sa of the CAS signal line 56a, the CAS signal Sa is lowered with a delay corresponding to the time constant (Ra×C2) of the RC circuit 23a. The buffer 24 of the CAS signal line 56a switches its output voltage from a high level to a low level when the CAS signal Sa becomes lower than a threshold value TH2. The DRAM 44 recognizes the lowering of the CAS signal Sa when the output voltage of the buffer 24 is switched to the low level, then starts reading out data from a corresponding portion of a column address and outputs the data into the data line group 54a after a lapse of access time Tca.

As described before, the RC circuits 23a to 23d of the CAS signal lines 56a to 56d have the time constants (Ra× C2), (Rb×C2), (Rc×C2) and (Rd×C2), respectively, wherein (Ra×C2)<(Rb×C2)<(Rc×C2)<(Rd×C2).

When the controller 45 asserts CAS signals Sa, Sb, Sc and Sd of the CAS signal lines 56a, 56b, 56c and 56d simultaneously, the CAS signals Sa, Sb, Sc and Sd are lowered in level to below than the threshold value TH2 of the buffers 24 in the order named, so that the buffers 24 of the CAS signal lines 56a, 56b, 56c and 56d switch their output voltages from the high level to the low level in the order named. Accordingly, the DRAM 44 recognizes the lowering of the CAS signals Sa, Sb, Sc and Sd in the order named.

Specifically, the DRAM 44 recognizes the lowering of the CAS signal Sb after a lapse of Dt21 from the lowering of the CAS signal Sa, the lowering of the CAS signal Sc after a lapse of Dt22 from the lowering of the CAS signal Sb, and the lowering of the CAS signal Sd after a lapse of Dt23 from the lowering of the CAS signal Sc.

As a result, data is outputted into the data line group 54b after a lapse of Dt21 from a data output into the data line group 54a, data is outputted into the data line group 54c after a lapse of Dt22 from the data output into the data line group 54b, and data is outputted into the data line group 54d after a lapse of Dt23 from the data output into the data line group 54c.

The data outputted into the data line groups 54a to 54d are taken into the controller 45 simultaneously at a certain timing while all the data are valid.

Since the assert timing of each of the CAS signals Sa, Sb, Sc and Sd is also delayed in the same manner at the time of data writing, data outputted onto the data bus 54 by the controller 45 are inputted into the DRAM 44 via the data line groups 54a to 54d with time delays in the order named.

As described above, according to this embodiment, the CAS signal lines 56a to 56d are provided with the buffers 24 at the output side of the RC circuits 23a to 23d, respectively, so that the change in load capacitance depending on the presence or absence of the DRAM 43 and/or the DRAM 44 is prevented from influencing the time constants of the RC circuits 23a to 23d.

Therefore, irrespective of the number of memories mounted in the memory system, the time constants of the RC circuits 23a to 23d of the CAS signal lines 56a to 56d can be held constant. Accordingly, the assert timings of the CAS signals Sa to Sd of the CAS signal lines 56a to 56d can be reliably staggered, and thus, the input/output timing of data into/from each of the data input/output buffer groups 12a to 12d can be reliably staggered.

Further, since impedance of the CAS signal lines 56a to 56d can be set small, the memory system with a high anti-noise property can be realized.

Fourth Embodiment

Figure 8:
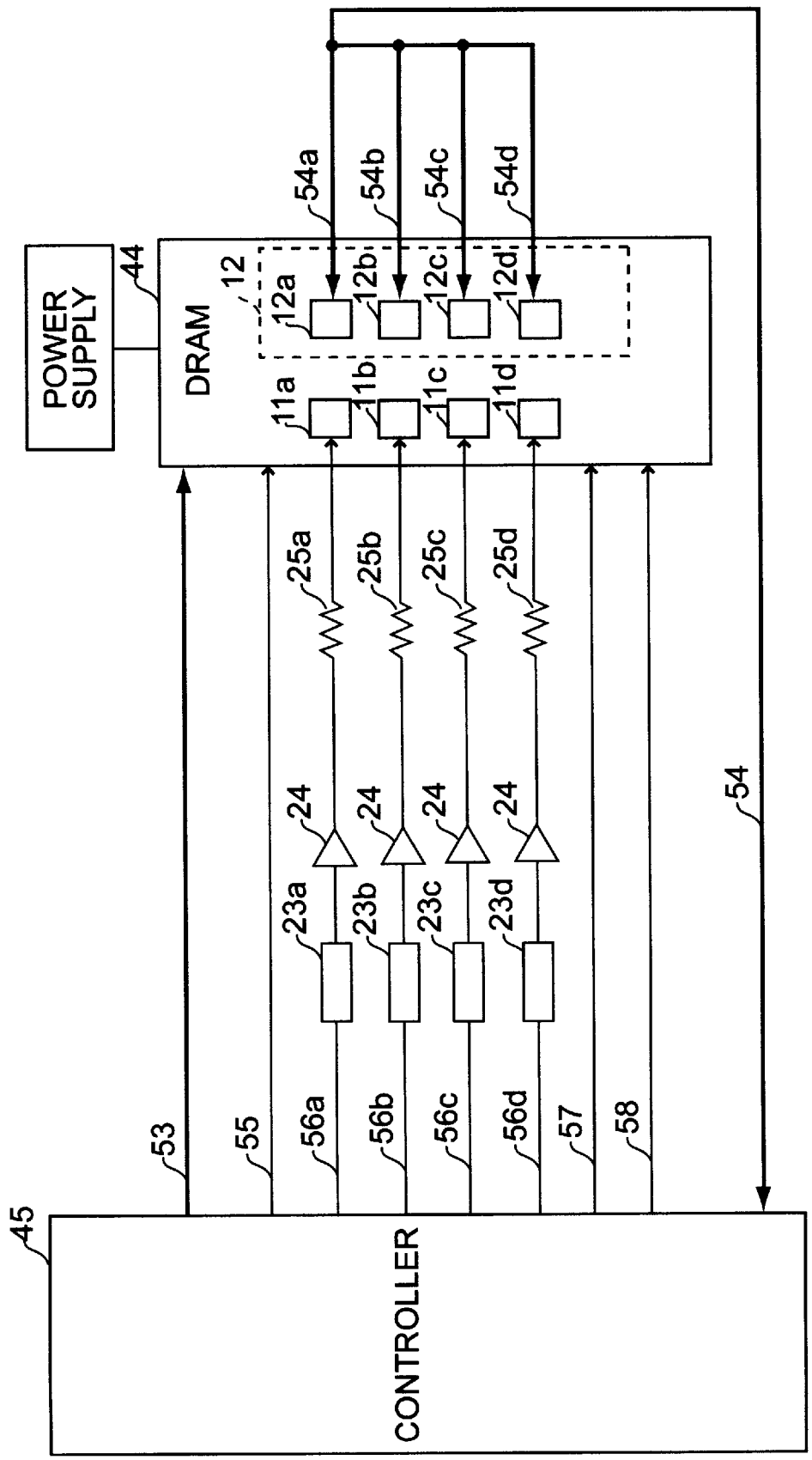
FIG. 8 is a block diagram showing the main part of a memory system according to a fourth preferred embodiment of the present invention.

FIG. 8 is a block diagram showing the main part of a memory system according to the fourth preferred embodiment of the present invention.

As shown in FIG. 8, in the memory system of this embodiment, resistors 25a to 25d are further provided as compared with the memory system of the third preferred embodiment. Specifically, the CAS signal lines 56a to 56d are further provided with the resistors 25a to 25d which are connected in series at the output side of the buffers 24, respectively.

The resistors 25a to 25d have resistance values R2a, R2b, R2c and R2d, respectively. It is set that R2a<R2b<R2c<R2d.

The resistor 25a of the CAS signal line 56a, cooperatively with the input buffer 11a having the input terminal stray capacitance C1, constitutes a time constant circuit having a time constant t3a (=R2a×C1) so as to delay the timing of the lowering of the output voltage of the buffer 24.

Similarly, the resistor 25b of the CAS signal line 56b, cooperatively with the input buffer 11b, constitutes a time constant circuit having a time constant t3b (=R2b×C1), the resistor 25c of the CAS signal line 56c, cooperatively with the input buffer 11c, constitutes a time constant circuit having a time constant t3c (=R2c×C1), and the resistor 25d of the CAS signal line 56d, cooperatively with the input buffer 11d, constitutes a time constant circuit having a time constant t3d (=R2d×C1), so as to delay the timings of the lowering of the output voltages of the buffers 24, respectively. Naturally, t3a<t3b<t3c<t3d.

If differences of the time constants among the RC circuits 23a to 23d are set large to increase time offsets Dt21, Dt22 and Dt23 among the assert timings on the CAS signal lines 56a to 56d, a malfunction of the memory system is likelier to occur due to superimposition of noise on the CAS signal. This is because the lowering of the CAS signal advances more slowly as the time constant of the RC circuit increases.

Figure 9:
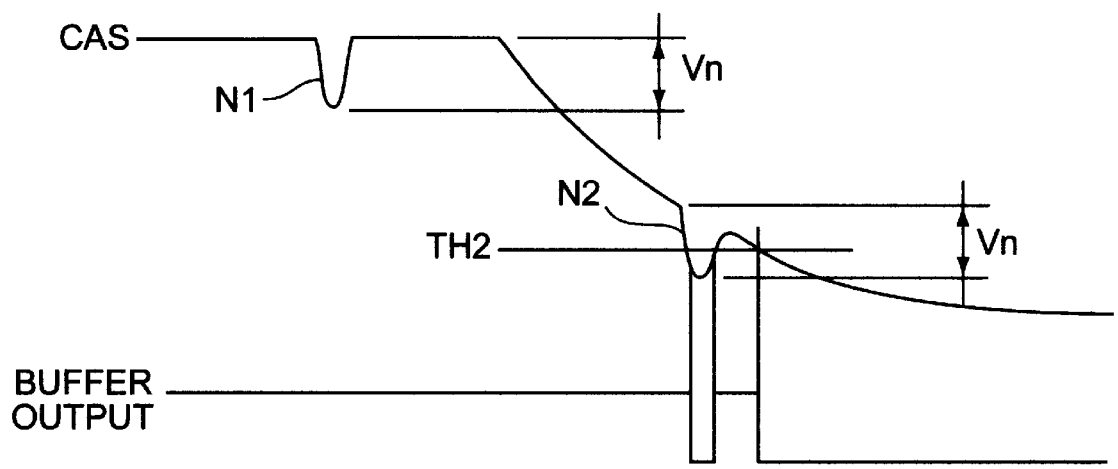
FIG. 9 is a diagram showing an example wherein noise is superimposed on a CAS signal.

FIG. 9 is a diagram showing an example wherein noise is superimposed on a CAS signal.

As shown in FIG. 9, if noise N1 with voltage Vn is superimposed when the CAS signal is at a high level, since the CAS signal is sufficiently higher than the threshold value TH2 of the buffer 24, the noise N1 does not affect an output of the buffer 24.

On the other hand, if noise N2 with voltage Vn is superimposed on the CAS signal during transition from a high level to a low level, the CAS signal may temporarily become smaller than the threshold value TH2 to affect an output of the buffer 24. This may cause a malfunction of the memory system.

Figure 10:
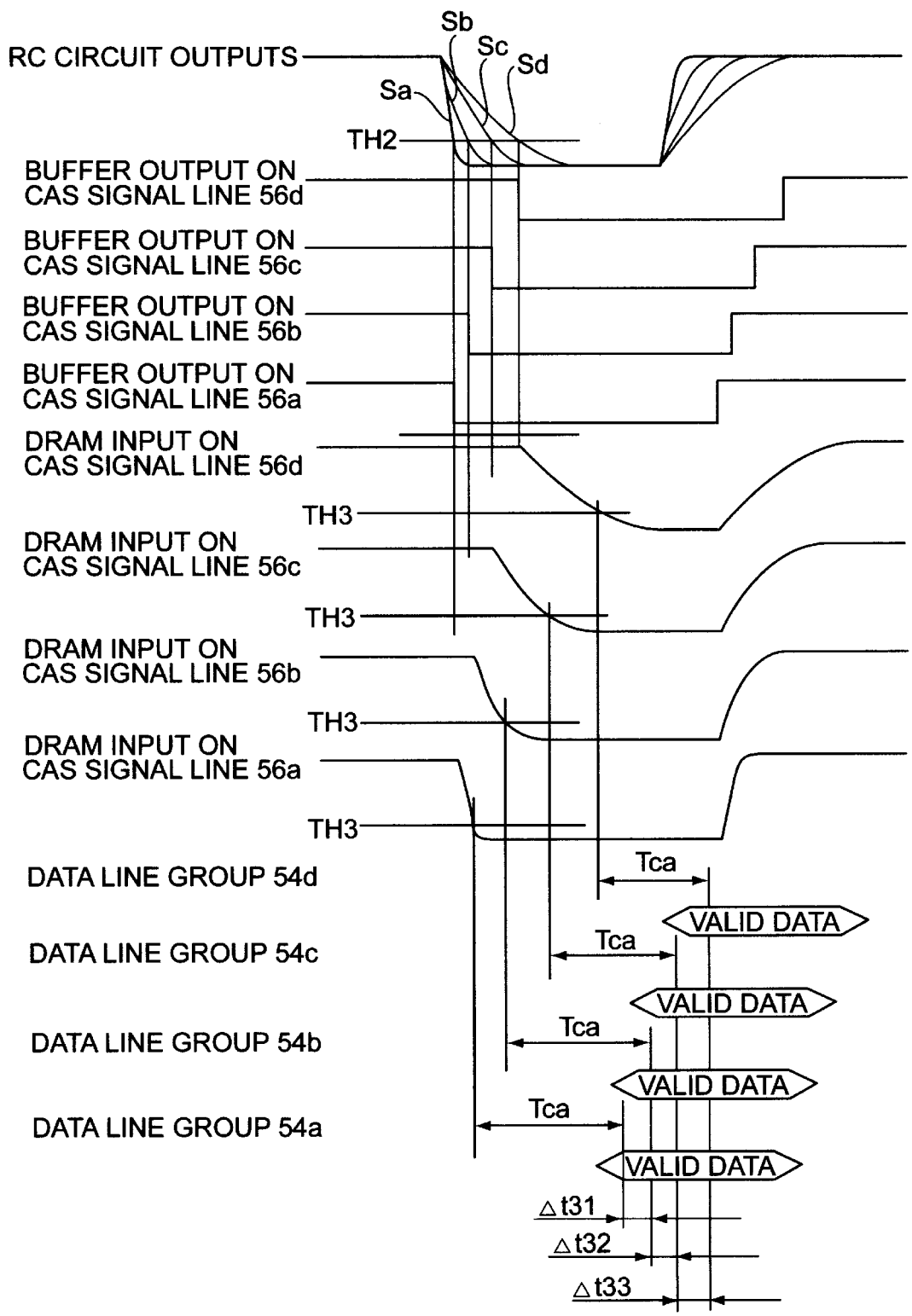
FIG. 10 is a diagram showing the assert timings of CAS signals in the memory system shown in FIG. 8.

FIG. 10 is a diagram showing the assert timing of each of the CAS signals in the memory system according to this embodiment.

When the controller 45 asserts the CAS signals Sa to Sd of the CAS signal lines 56a to 56d simultaneously, the CAS signals Sa to Sd are lowered in the order named with time delays caused by the time constants of the RC circuits 23a to 23d of the CAS signal lines 56a to 56d, respectively.

The buffers 24 of the CAS signal lines 56a to 56d switch their output voltages from a high level to a low level when the corresponding CAS signals Sa to Sd become smaller than the threshold value TH2 of the buffers 24.

The lowering of the output voltages of the buffers 24 of the CAS signal lines 56a to 56d is recognized by the DRAM 44 with further time delays caused by the time constants t3a to t3d, respectively.

The DRAM 44 recognizes the lowering of the CAS signal Sb after a lapse of Dt31 from the lowering of the CAS signal Sa, the lowering of the CAS signal Sc after a lapse of Dt32 from the lowering of the CAS signal Sb, and the lowering of the CAS signal Sd after a lapse of Dt33 from the lowering of the CAS signal Sc.

As a result, data is outputted into the data line group 54b after a lapse of Dt31 from a data output into the data line group 54a, data is outputted into the data line group 54c after a lapse of Dt32 from the data output into the data line group 54b, and data is outputted into the data line group 54d after a lapse of Dt33 from the data output into the data line group 54c.

The data outputted into the data line groups 54a to 54d are taken into the controller 45 simultaneously at a certain timing while all the data are valid.

Since the assert timings of the CAS signals Sa, Sb, Sc and Sd are also delayed in the same manner at the time of data writing, data outputted onto the data bus 54 by the controller 45 are inputted into the DRAM 44 via the data line groups 54a to 54d with time delays in the order named.

As described above, according to this embodiment, the CAS signal lines 56a to 56d are provided with the resistors 25a to 25d connected in series at the output side of the buffers 24, respectively, so that the assert timings of the CAS signals Sa to Sd of the CAS signal lines 56a to 56d can be further staggered. Thus, the input/output timings of data into/from the data input/output buffer groups 12a to 12d can be further staggered.

Further, since the time constants of the RC circuits 23a to 23d can be set smaller to some extent so as to reduce the likelihood of superimposition of noise during the transition of the CAS signals, a stable operation of the memory system can be ensured.

Figure 11:
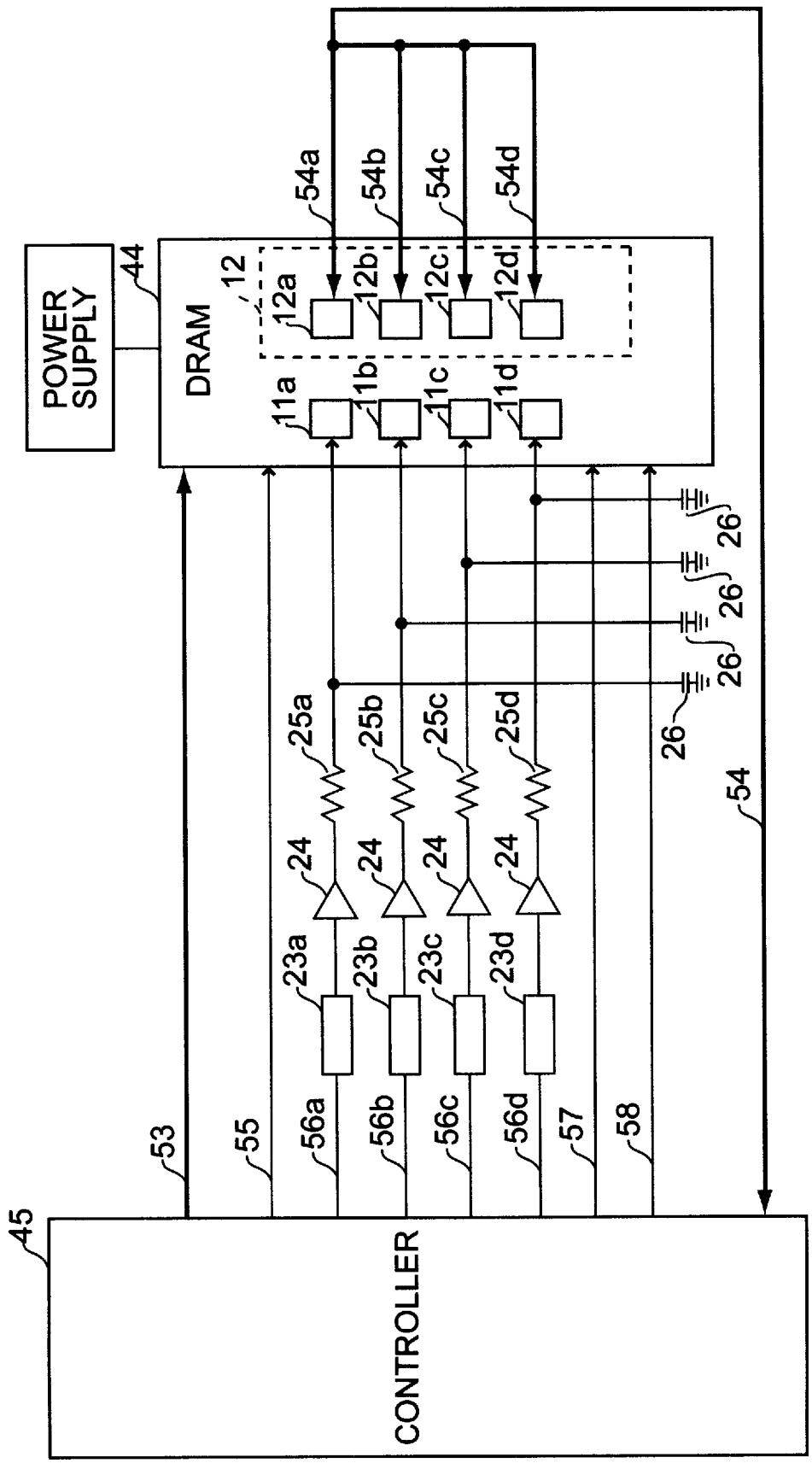
FIG. 11 is a block diagram showing a modification of the memory system shown in FIG. 8.

FIG. 11 is a diagram showing a modification of the memory system shown in FIG. 8.

As shown in FIG. 11, in the memory system of the modification, the CAS signal lines 56a to 56d are further provided, like in the memory system shown in FIG. 4 of the second preferred embodiment, with capacitors 26 at the output side of the resistors 25a to 25d, respectively. Each of the capacitors 26 has one end connected to the corresponding CAS signal line and the other end grounded. According to this modification, the lower timing of the output voltages of the buffers 24 as recognized by the DRAM 44 can be further staggered among the CAS signal lines 56a to 56d.

Fifth Embodiment

Figure 12:
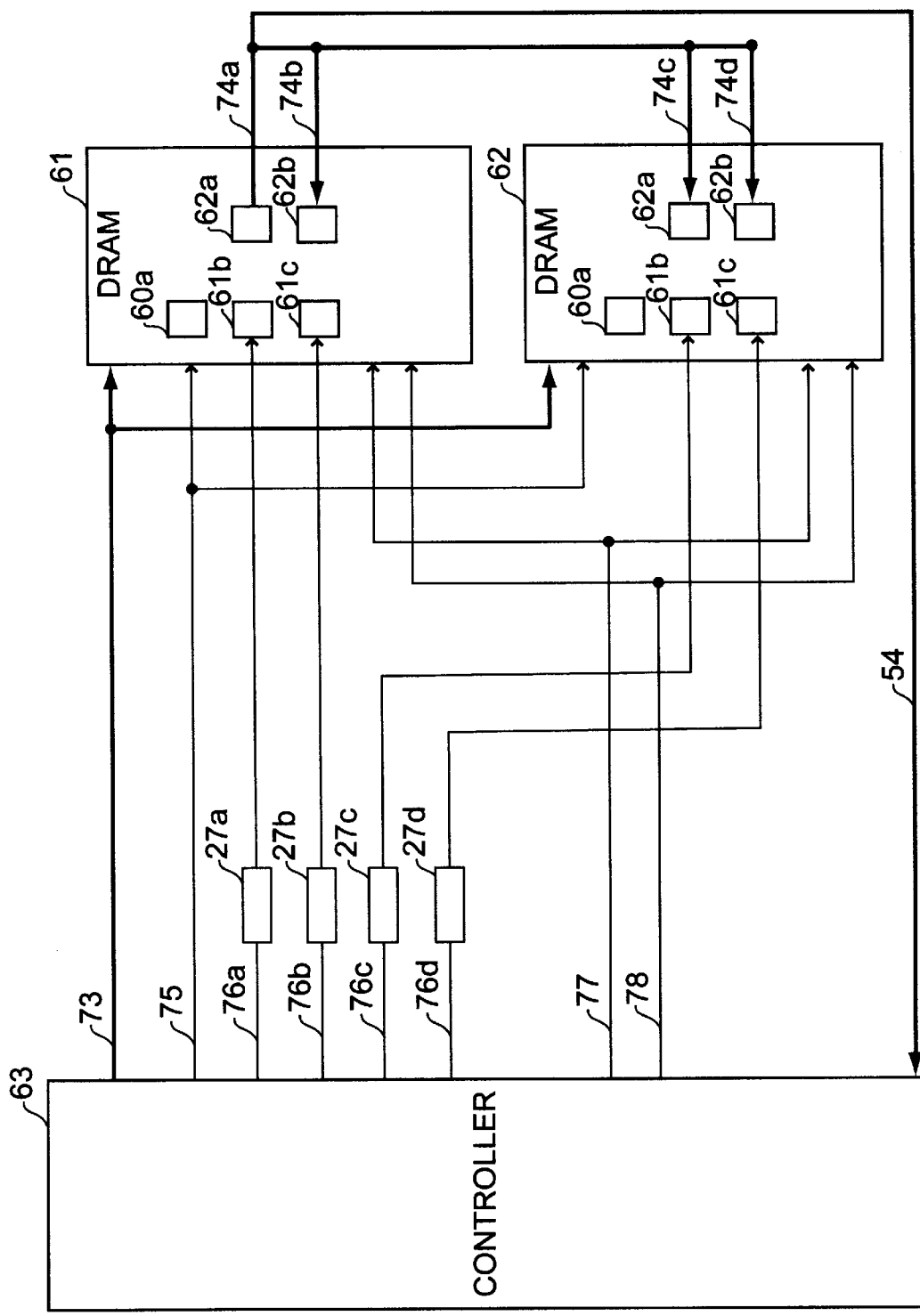
FIG. 12 is a block diagram showing a structure of a memory system according to a fifth preferred embodiment of the present invention.

FIG. 12 is a block diagram showing a structure of a memory system according to the fifth preferred embodiment of the present invention.

As shown in FIG. 12, the memory system comprises a DRAM 61, a DRAM 62 and a controller 63 for controlling an operation of the DRAM's 61 and 62.

An address bus 73, a RAS signal line 75, a read signal line 77 and a write signal line 78 connected to the controller 63 are connected to both the DRAM's 61 and 62, respectively. CAS signal lines 76a and 76b connected to the controller 63 are connected to the DRAM 61, while CAS signal lines 76c and 76d connected to the controller 63 are connected to the DRAM 62.

A data bus 74 connected to the controller 63 is composed of 32-bit date lines. The 32-bit data lines are put into data line groups 74a, 74b, 74c and 74d each composed of 8-bit data lines. The data line groups 74a and 74b are connected to the DRAM 61, while the data line groups 74c and 74d are connected to the DRAM 62.

Each of the address bus 73 and the data bus 74 is a positive-true logic signal line, while each of the RAS signal line 75, the CAS signal lines 76a to 76d, the read signal line 77 and the write signal line 78 is a negative-true logic signal line.

The controller 63 outputs onto the address bus 73 a row address common to the DRAM's 61 and 62 and then column addresses for the DRAM's 61 and 62, respectively, and controls the states of control signals of the respective control signal lines so as to read out or write data of 16 bits at maximum from and into the DRAM's 61 and 62, respectively.

The controller 63 outputs a column address/addresses representing 8-bit data, 16-bit data or 32-bit data, chooses one, two or four of the CAS signal lines 76a to 76d corresponding to the outputted column address/addresses, and asserts a CAS signal/CAS signals of the chosen CAS signal line/lines. When a plurality of the CAS signal lines are chosen, the controller 63 asserts the CAS signals thereof simultaneously.

When the CAS signals of the chosen CAS signal lines are asserted by the controller 63, the DRAM's 61 and 62 latch the column addresses outputted onto the address bus 73 by the controller 63 and choose data corresponding to the column addresses, respectively.

The CAS signal line 76a is provided with a time constant circuit 27a having a time constant t4a, the CAS signal line 76b is provided with a time constant circuit 27b having a time constant t4b, the CAS signal line 76c is provided with a time constant circuit 27c having a time constant t4c, and the CAS signal line 76d is provided with a time constant circuit 27d having a time constant t4d. It is set that t4a<t4c<t4b<t4d.

The DRAM 61 comprises an input buffer 60a connected to the RAS signal line 75, and input buffers 61a and 61b connected to the CAS signal lines 76a and 76b, respectively. The input buffers 61a and 61b each have an input terminal stray capacitance C1.

The time constant circuit 27a of the CAS signal line 76a, cooperatively with the input buffer 61a, delays the assert timing of the CAS signal of the CAS signal line 76a, and the time constant circuit 27b of the CAS signal line 76b, cooperatively with the input buffer 61b, delays the assert timing of the CAS signal of the CAS signal line 76b.

The DRAM 61 is further provided with a data input/output buffer group 62a corresponding to the input buffer 61a and further corresponding to the date line group 74a, and with a data input/output buffer group 62b corresponding to the input buffer 61b and further corresponding to the data line group 74b.

Similarly, the DRAM 62 comprises an input buffer 60b connected to the RAS signal line 75, and input buffers 61c and 61d connected to the CAS signal lines 76c and 76d, respectively. The input buffers 61c and 61d each have an input terminal stray capacitance C1.

The time constant circuit 27c of the CAS signal line 76c, cooperatively with the input buffer 61c, delays the assert timing of the CAS signal of the CAS signal line 76c, and the time constant circuit 27d of the CAS signal line 76d, cooperatively with the input buffer 61d, delays the assert timing of the CAS signal of the CAS signal line 76d.

The DRAM 62 is further provided with a data input/output buffer group 62c corresponding to the input buffer 61c and further corresponding to the date line group 74c, and with a data input/output buffer group 62d corresponding to the input buffer 61d and further corresponding to the data line group 74d.

Figure 13:
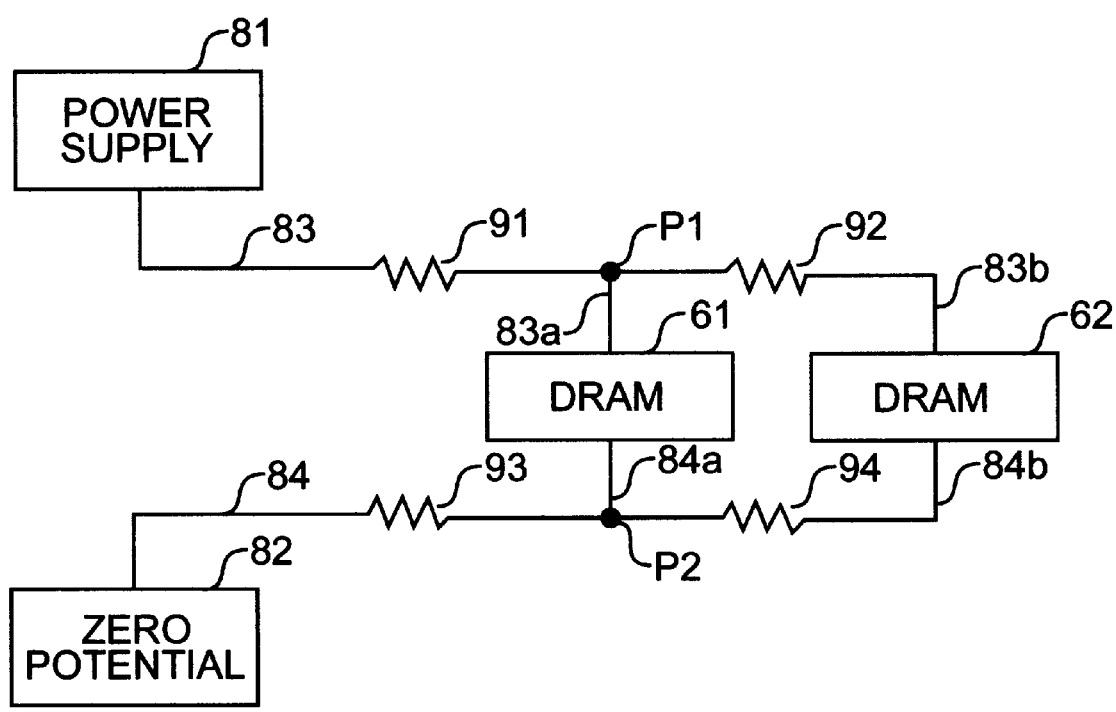
FIG. 13 is a diagram showing a connection state of DRAM's shown in FIG. 12 with respect to a power supply and a zero potential.

FIG. 13 is a diagram showing a connection state of the DRAM's 61 and 62 shown in FIG. 12 with respect to a power supply 81 and a zero potential 82.

As shown in FIG. 13, a power supply line 83 connected to the power supply 81 is bifurcated at point P1 into power supply lines 83a and 83b. The power supply line 83a is connected to the DRAM 61, while the power supply line 83b is connected to the DRAM 62.

A zero potential line 84 grounded to the zero potential 82 is bifurcated at point P2 into zero potential lines 84a and 84b. The zero potential line 84a is connected to the DRAM 61, while the zero potential line 84b is connected to the DRAM 62.

The power supply line 83 comprises a power supply pattern on a substrate, a cable, a connector, etc., and the zero potential line 84 comprises a zero potential pattern, a cable, a connector, etc.

A resistor 91 equivalently represents an impedance of the power supply line 83 between the power supply 81 and the DRAM 61, while a resistor 92 equivalently represents an impedance of the power supply line 83 between the DRAM's 61 and 62.

A resistor 93 equivalently represents an impedance of the zero potential line 84 between the zero potential 82 and the DRAM 61, while a resistor 94 equivalently represents an impedance of the zero potential line 84 between the DRAM's 61 and 62.

Figure 14:
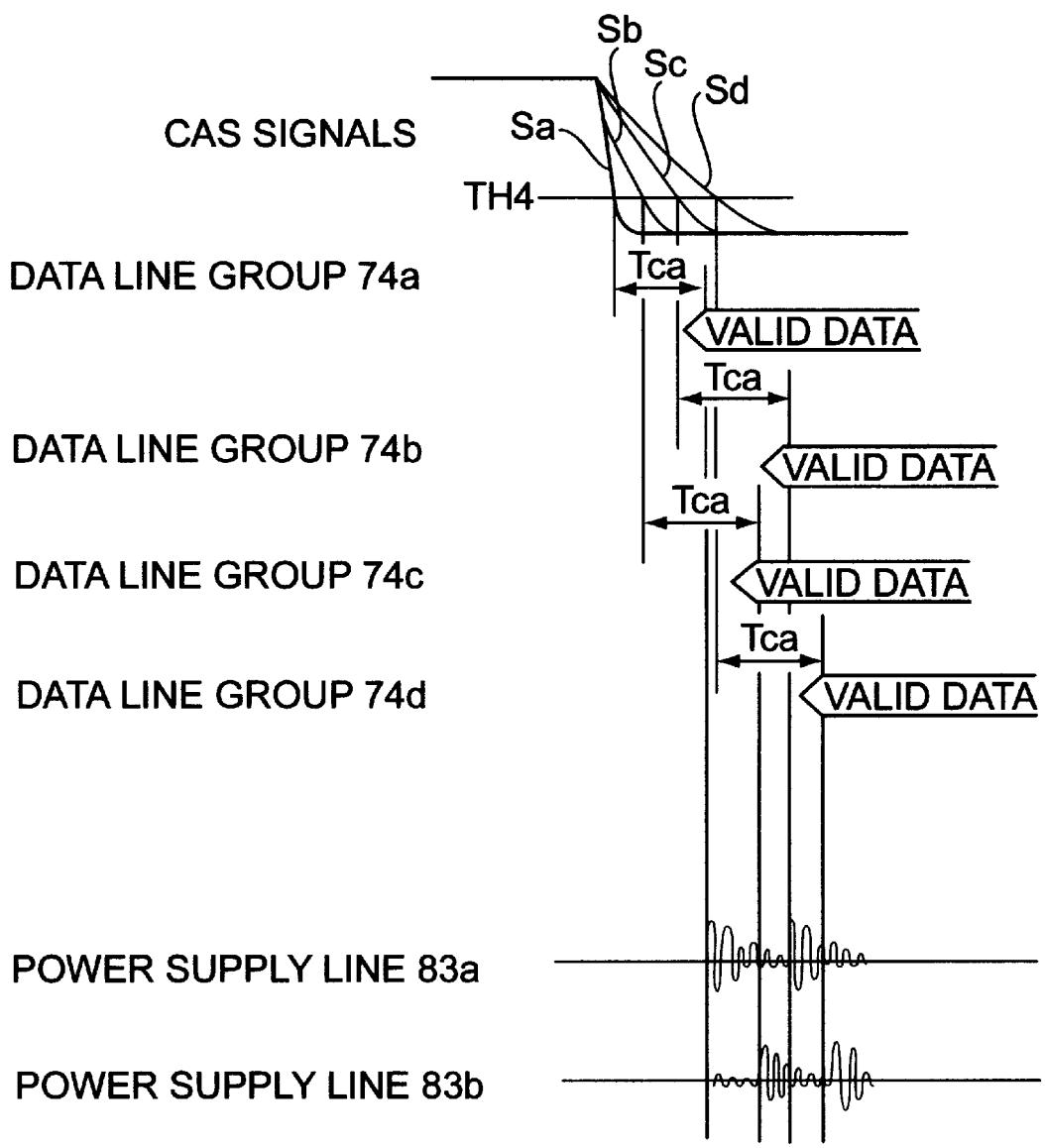
FIG. 14 is a diagram showing the assert timings of CAS signals in the memory system shown in FIGS. 12 and 13.

FIG. 14 is a diagram showing the assert timings of the CAS signals in the memory system shown in FIGS. 12 and 13.

It is assumed that the controller 63 accesses 16-bit data to the DRAM's 61 and 62, respectively.

When the controller 63 asserts CAS signals Sa to Sd of the CAS signal lines 76a to 76d simultaneously, since the time constants t4a to t4d of the time constant circuits 27a to 27d are set such that t4a<t4c<t4b<t4d, the CAS signals Sa to Sd are lowered in order of Sa, Sc, Sb and Sd.

As a result, the CAS signal Sa first becomes smaller than a threshold value TH4, which is recognized by the DRAM 61. Then, the CAS signal Sc becomes smaller than TH4, which is recognized by the DRAM 62. Then, the CAS signal Sb becomes smaller than TH4, which is recognized by the DRAM 61. Finally, the CAS signal Sd becomes smaller than TH4, which is recognized by the DRAM 62.

When the lowering of the CAS signal Sa is recognized, the DRAM 61 starts reading out data from the corresponding column address and outputs the data into the corresponding data line group 74a after a lapse of access time Tca. In this event, voltage fluctuation occurs on the power supply line 83a, and is then attenuated by the impedance of the resistor 92 and transferred to the power supply line 83b.

Subsequently, the DRAM 62 recognizes the lowering of the CAS signal Sc to start reading out data from the corresponding column address, and outputs the data into the corresponding data line group 74c after a lapse of access time Tca. In this event, voltage fluctuation occurs on the power supply line 83b, and is then attenuated by the impedance of the resistor 92 and transferred to the power supply line 83a.

Subsequently, the DRAM 61 recognizes the lowering of the CAS signal Sb to start reading out data from the corresponding column address, and outputs the data into the corresponding data line group 74b after a lapse of access time Tca. In this event, voltage fluctuation occurs on the power supply line 83a, and is then attenuated by the impedance of the resistor 92 and transferred to the power supply line 83b.

Subsequently, the DRAM 62 recognizes the lowering of the CAS signal Sd to start reading out data from the corresponding column address, and outputs the data into the corresponding data line group 74d after a lapse of access time Tca. In this event, voltage fluctuation occurs on the power supply line 83b, and is then attenuated by the impedance of the resistor 92 and transferred to the power supply line 83a.

As described above, according to this embodiment, the CAS signal lines 76a to 76d are provided with the time constant circuits 27a to 27d, respectively, so that the assert timings of the CAS signals Sa to Sd, which were asserted simultaneously by the controller 63, are staggered so as to be recognized by the DRAM's 61 and 62 alternately. Thus, data are outputted alternately from the DRAM's 61 and 62.

Accordingly, the abrupt voltage fluctuation is prevented from occurring continuously on the power supply lines and the zero potential lines of the same DRAM's. Thus, the voltage fluctuation caused by the operation of each DRAM can be suppressed to prevent a malfunction thereof and to lessen an influence of the voltage fluctuation upon the other DRAM. Further, an occurrence of EMI can be avoided.

Sixth Embodiment

Figure 15:
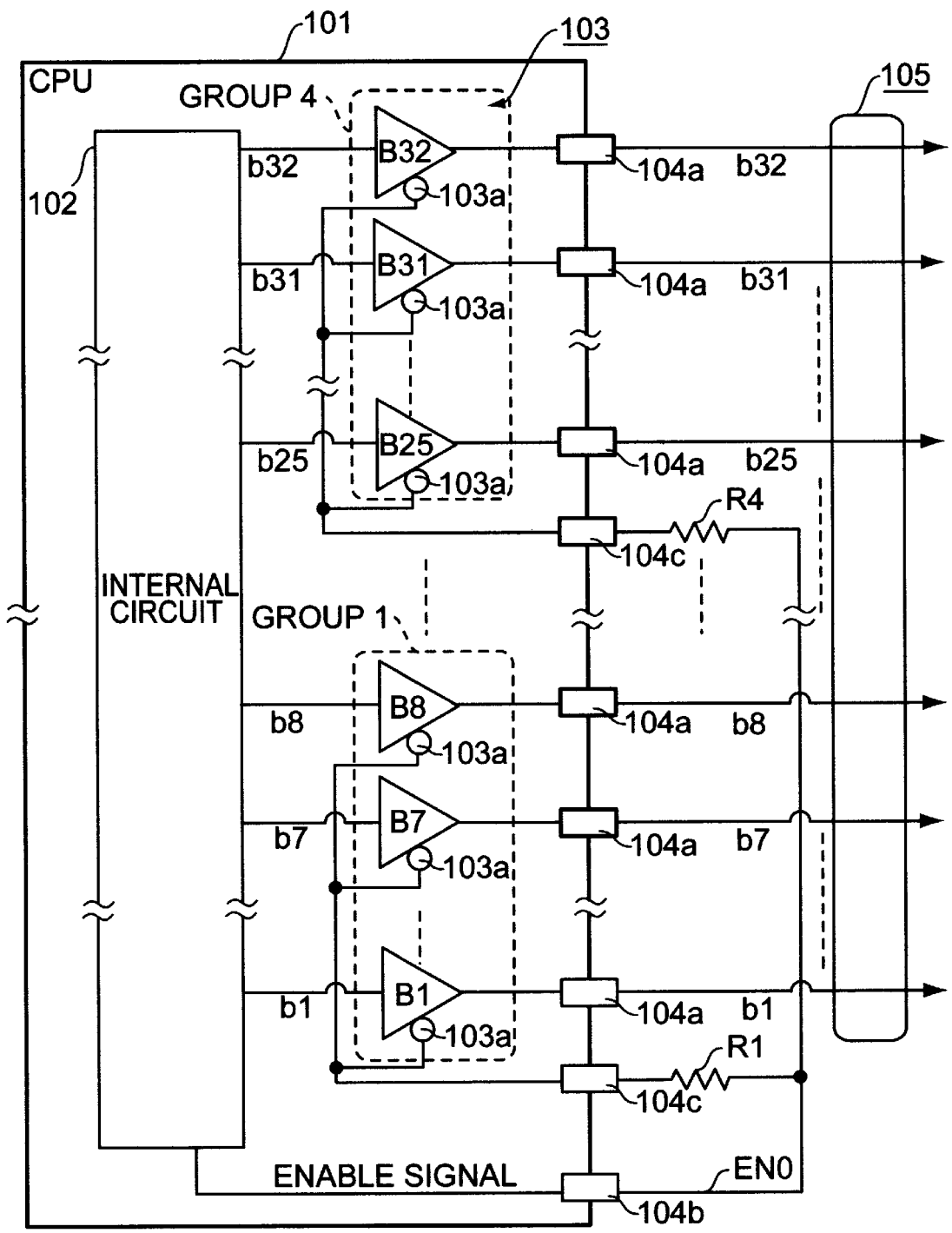
FIG. 15 is a block diagram showing a structure of a memory system according to a sixth preferred embodiment of the present invention.

FIG. 15 is a block diagram showing a structure of a memory system according to the sixth preferred embodiment of the present invention.

As shown in FIG. 15, the memory system comprises a CPU 101 for controlling an operation of the whole memory system. The CPU 101 comprises an internal circuit 102 and a buffer group 103. The buffer group 103 includes 32 buffers B1 to B32 each having a terminal 103a for receiving an enable signal and connected to the internal circuit 102. In this embodiment, the buffers B1 to B32 are put into four groups 1 to 4 each including 8 buffers. In the figure, the groups 2 and 3 are not shown. Output terminals 104a are connected to a bus 105 for outputting signals (bit signals) from the buffers B1 to B32, respectively. The bus 105 has a 32-bit bus width.

In this embodiment, the buffer B1 outputs a least significant bit signal, while the buffer B32 outputs a most significant bit signal.

The internal circuit 102 produces an enable signal for driving the buffer group 103. The enable signal is outputted via an output terminal 104b. The CPU 1 is further provided with four input terminals 104c (two of which are not shown in the figure) corresponding to the number of the groups (four in this embodiment) of the buffer group 103. Damping resistors R1 to R4 (R2 and R3 are not shown in the figure) are connected at their input sides to the output terminal 104b and at their output sides to the input terminals 104c, respectively. Accordingly, the enable signal outputted via the output terminal 104b is inputted again into the CPU 1 via the damping resistors R1 to R4 and the input terminals 104c.

The terminals 103a of the buffers in each of the groups 1 to 4 are connected to corresponding one of the input terminals 104c. Specifically, the buffers B1 to B8 of the group 1 are connected to the input terminal 104c connected to the damping resistor R1, the buffers B9 to B16 of the group 2 are connected to the input terminal 104c connected to the damping resistor R2, the buffers B17 to B24 of the group 3 are connected to the input terminal 104c connected to the damping resistor R3, and the buffers B25 to B32 of the group 4 are connected to the input terminal 104c connected to the damping resistor R4.

Figure 16:
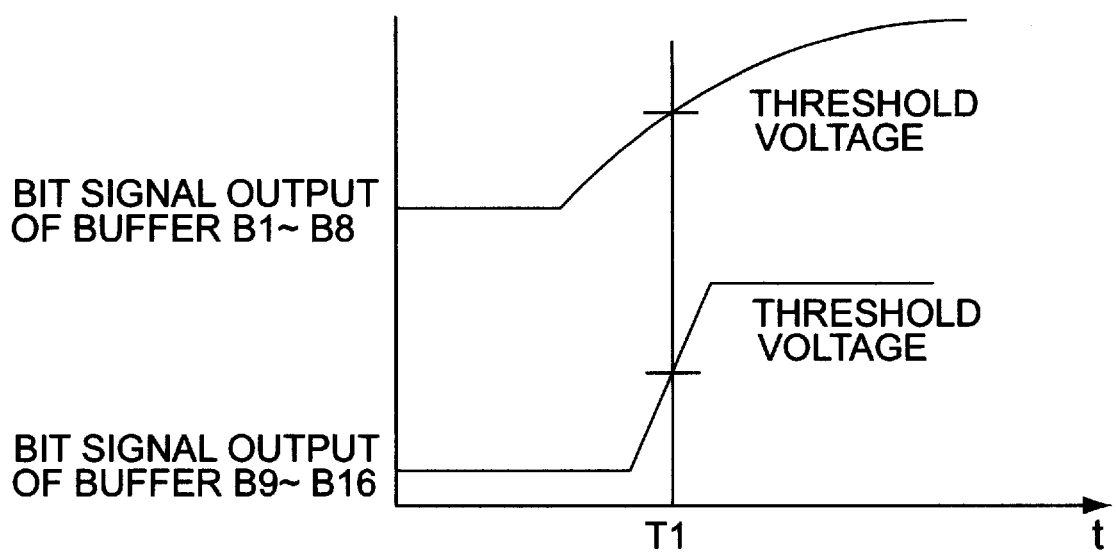
FIG. 16 is a diagram for explaining a difference in signal level change between a less significant bit signal and a more significant bit signal.

In general, with respect to the bus 105, the number of circuits connected to bus lines for less significant bits are greater than the number of circuits connected to bus lines for more significant bits due to an addressing method etc. Therefore, since the capacitance relating to the bus lines for less significant bits is greater than the capacitance relating to the bus lines for more significant bits, the change in signal level on the bus lines for less significant bits advances more slowly than that on the bus lines for more significant bits due to a difference in time constant. Accordingly, for example, as shown in FIG. 16, it is necessary to set a time of raising a voltage on a bus line for a less significant bit (B1–B8) earlier than that for a more significant bit (B9–B16) for matching a time when the voltage on the bus line for the less significant bit exceeds a threshold voltage, and a time when the voltage on the bus line for the more significant bit exceeds the threshold voltage, that is, for outputting both bits simultaneously at time T1. Accordingly, a resistance value of the resistor R1 for the less significant bits (B1–B8) is set smaller than that of the resistor R2 for the more significant bits (B9–B16). On the whole, resistance values r1 to r4 of the resistors R1 to R4 are set that r1<r2<r3<r4.

Figure 17:
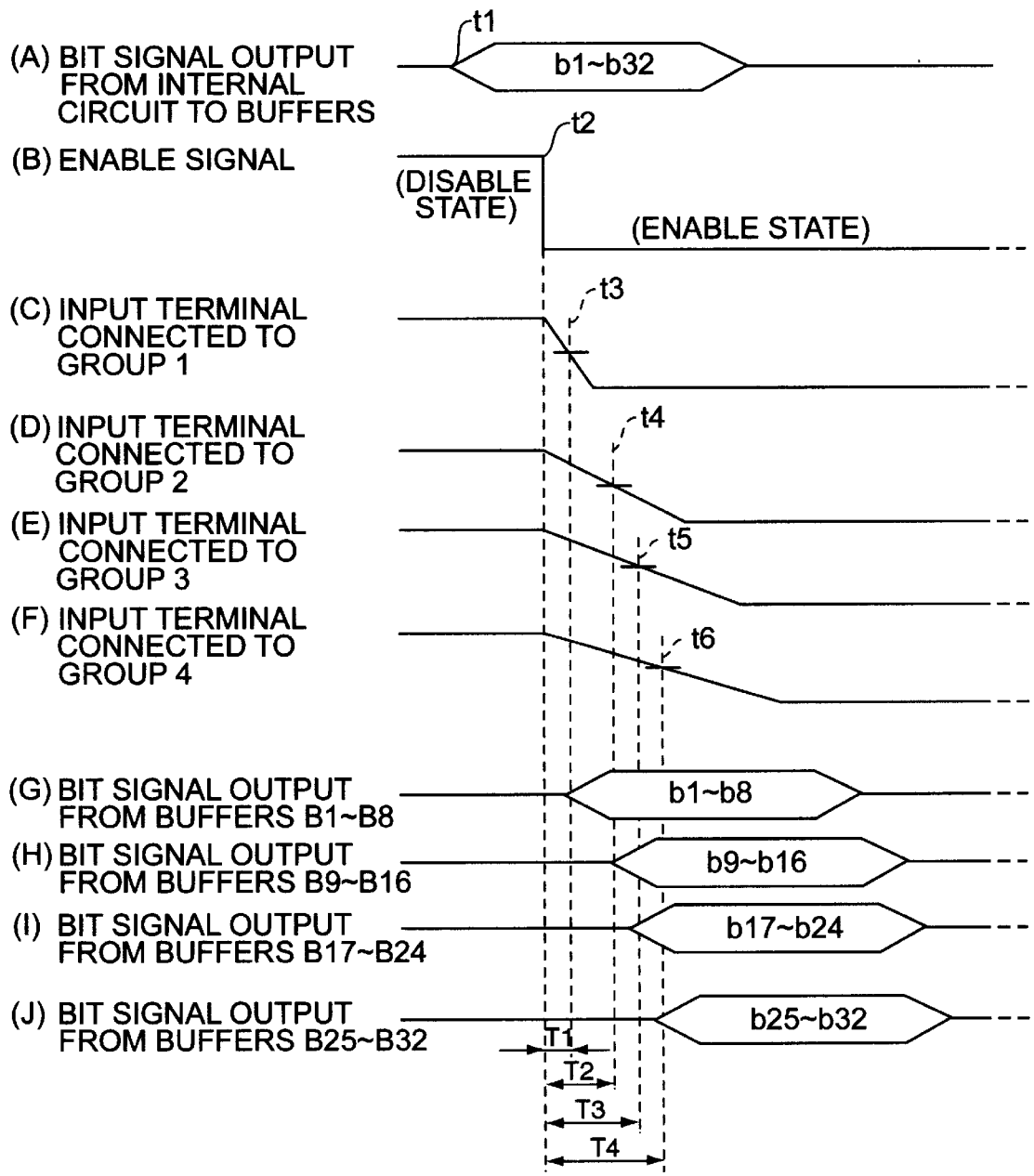
FIG. 17 is a timing chart according to the sixth preferred embodiment of the present invention.

Now, also referring to FIG. 17, a bit signal output operation in this embodiment will be described. FIG. 17 is a timing chart achieved in this embodiment.

As shown at (A) in FIG. 17, the internal circuit 102 outputs bit signals b1 to b32 to the buffers B1 to B32 of the groups 1 to 4 at time t1. Then, as shown at (B) in FIG. 17, the internal circuit 102 outputs an enable signal at time t2. The enable signal is outputted to the exterior of the CPU 1 via the output terminal 104b and then inputted into the CPU 1 via the damping resistors R1 to R4 and the corresponding input terminals 104c.

At this time, as described above, since the resistance value r1 of the damping resistor R1 is set smaller than the resistance values r2 to r4 of the other damping resistors R2 to R4, the enable signal is first inputted into the buffers B1 to B8 of the group 1. The buffers B1 to B8 output bit signals b1 to b8 at time t3, respectively.

Subsequently, the enable signal is inputted into the buffers B9 to B16 of the group 2 via the damping resistor R2 whose resistance value r2 is smaller than the resistance values r3 and r4 of the damping resistors R3 and R4. The buffers B9 to B16 output bit signal b9 to b16 at time t4, respectively.

Subsequently, the enable signal is inputted into the buffers B17 to B24 of the group 3 via the damping resistor R3 whose resistance value r3 is smaller than the resistance value r4 of the damping resistor R4. The buffers B17 to B24 output bit signal b17 to b24 at time t5, respectively.

Finally, the enable signal is inputted into the buffers B25 to B32 of the group 4 via the damping resistor R4. The buffers B25 to B32 output bit signals b25 to b32 at time t6, respectively.

The timings when the enable signal is inputted into the groups 1 to 4 of the buffer group 103, i.e. the output timings of the bit signals b1 to b32, are staggered with time delays T1, T2, T3 and T4 as shown in FIG. 17 depending on the resistance values r1 to r4 of the damping resistors R1 to R4.

Figure 18:
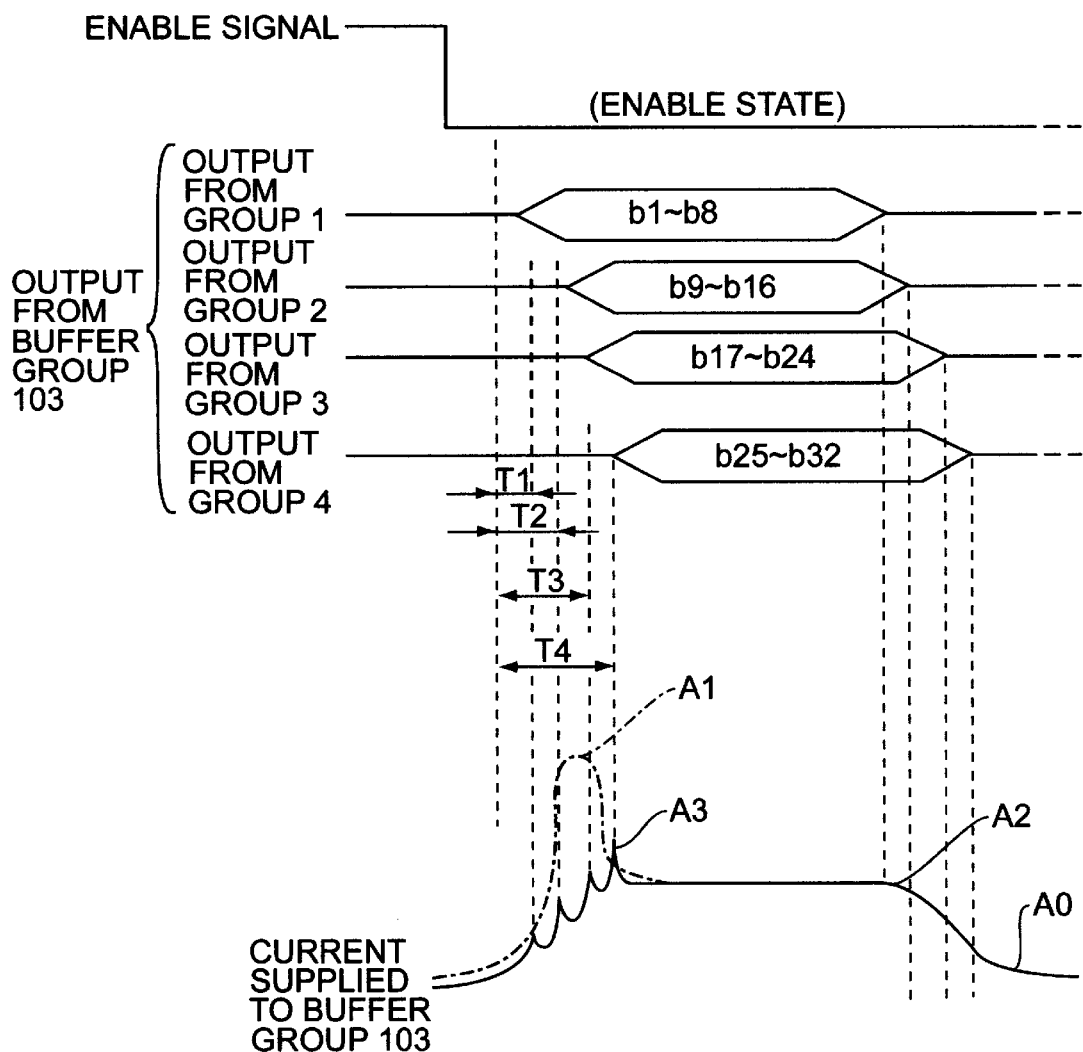
FIG. 18 is a diagram for explaining magnitudes of current supplied to a buffer group incorporated in the memory system shown in FIG. 15.

FIG. 18 is a diagram for explaining magnitudes of current supplied to the buffer group 103 incorporated in the memory system shown in FIG. 15. In the Figure, A1, A2, A3 and A0 show absolute values of the current supplied to the buffer group 103. A two-dot chain line including A1 represents magnitudes of the supplied current when all the bit signals b1 to b32 are outputted simultaneously, wherein A1 represents a point of the maximum magnitude of the supplied current. A2 represents a magnitude of the supplied current when the bit signals b1 to b32 are outputted onto the bus 105. A3 represents a point of the maximum magnitude of the supplied current when the bit signals b25 to b32 of the group 4 are outputted. A0 represents a magnitude of the supplied current when outputting of the bit signals b1 to b32 is finished.

As seen from FIG. 18, by staggering the output timings of the bit signals among the groups, the instantaneous maximum magnitudes of the supplied current can be made smaller as compared with the instantaneous maximum magnitude of the supplied current when all the bit signals b1 to b32 are outputted simultaneously.

As described above, according to this embodiment, the buffer group 103 composed of 32 buffers B1 to B32 is divided into four groups, and the input timings of the enable signal are staggered among the groups using the damping resistors R1 to R4, so that the output timings of the bit signals can be staggered. As a result, the instantaneous maximum magnitudes of the current supplied to the buffer group 103 can be reduced as compared with the case wherein the buffer group 103 outputs all the bit signals simultaneously, and thus, radiant noise from the buffer group 103 can be suppressed.

Seventh Embodiment

If the number of devices connected to an external bus of a CPU is increased, the drive current to buffers of the CPU may be enlarged for driving all the devices. However, if the buffer drive current is increased, the current supplied to the CPU is also increased to deteriorate an EMI characteristic and a thermal characteristic. Therefore, in general, when a scale of an electronic circuit is enlarged, exterior buffers are provided before each of the devices.

On the other hand, if the exterior buffers are added, radiant noise from these buffers is produced to deteriorate the EMI characteristic. Further, a wiring length of the external bus connecting the external buffers and the devices becomes large, so that the wiring works as an antenna to increase the radiant noise.

Figure 19:
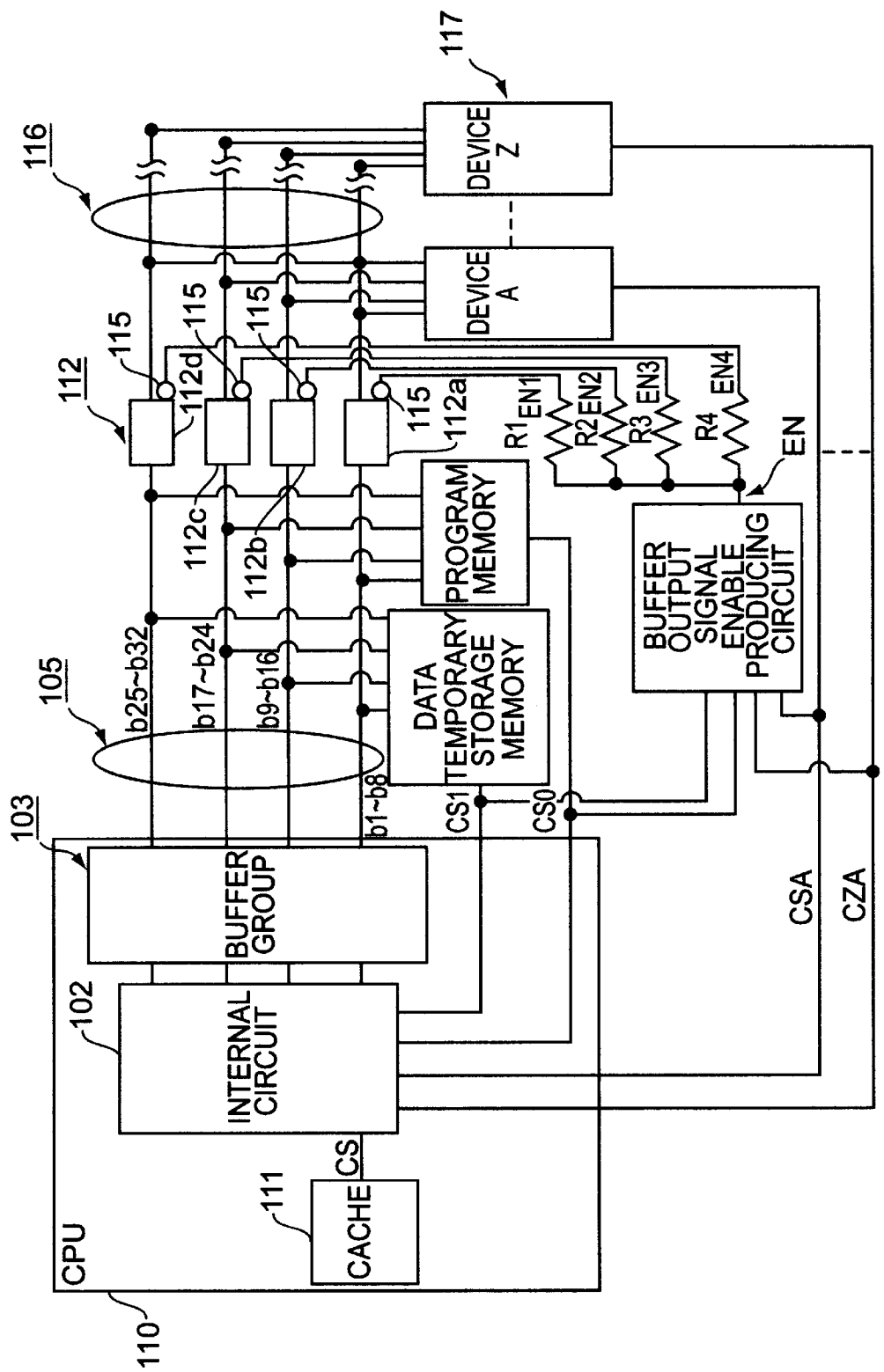
FIG. 19 is a block diagram showing a structure of a memory system according to a seventh preferred embodiment of the present invention.

This embodiment aims to solve the foregoing problem by reducing the radiant noise from the external buffers and by substantially shortening the wiring length of the external bus. Herein below, the seventh preferred embodiment will be described with reference to FIG. 19. FIG. 19 is a block diagram showing a structure of a memory system according to the seventh preferred embodiment of the present invention.

In the Figure, the memory system comprises a CPU 110 for controlling an operation of the whole memory system. The CPU 110 comprises an internal circuit 102 and an internal buffer group 103 which are the same as those in the sixth preferred embodiment, and further comprises a cache 111 connected to the internal circuit 102. Like in the sixth preferred embodiment, the buffer group 103 is connected to an external bus 105 of a 32-bit bus width. Only in case of a mishit to the cache 111, the CPU 110 accesses an external device, such as a memory. In this case, the CPU 110 outputs a selection signal to the external device to be accessed. The selection signal is produced in the internal circuit 102.

To the bus 105 are connected four groups 112a to 112d of an external buffer group 112, a data temporary storage memory 113 in the form of a RAM and a program memory 114 in the form of a ROM. Each of the groups 112a to 112d has a terminal 115 for receiving an enable signal, and includes 8 buffers (not shown) for driving bus signals. An external bus 116 of a 32-bit bus width is connected to the external buffer group 112 at an output side thereof. To the bus 116 are connected a plurality of external devices 117, such as a network board, an LSI, a hard disk, etc. The memories 113 and 114 and the external devices 117 are also connected to the internal circuit 102.

In this embodiment, the enable signal for driving the external buffer group 112 is produced at a buffer output enable signal producing circuit 118. To the enable signal producing circuit 118 are connected damping resistors R1 to R4 in parallel to each other, having resistance values r1 to r4, respectively. Like in the sixth preferred embodiment, the resistance values r1 to r4 are adjusted corresponding to capacitance of bus lines of the bus 116, and set such that r1<r2<r3<r4.

The damping resistors R1 to R4 are connected to the terminals 115 of the external buffer groups 112a to 112d, respectively.

In FIG. 19, CS represents an access signal outputted from the internal circuit 102 to the cache 111, CS0 represents a selection signal outputted from the internal circuit 102 to the program memory 114, CS1 represents a selection signal outputted from the internal circuit 102 to the data temporary storage memory 113, and CSA to CSZ represent selection signals outputted from the internal circuit 102 to the external devices 117, respectively. Further, EN represents an enable signal outputted from the enable signal producing circuit 118. The enable signal EN after having passed the damping resistors R1 to R4 will be represented by EN1 to EN4, respectively.

Figure 20:
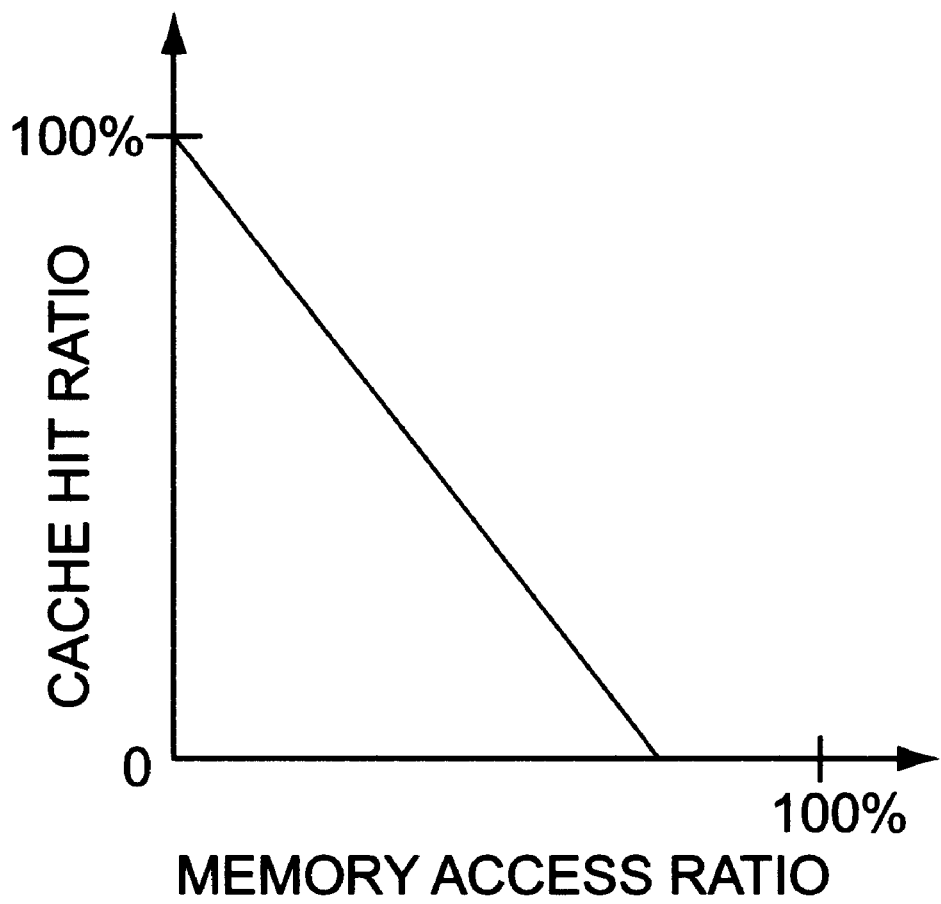
FIG. 20 is a diagram for explaining a relationship between a cache hit ratio and a memory access ratio according to the seventh preferred embodiment of the present invention.

FIG. 20 is a diagram for explaining a relationship between a hit ratio of the cache 111 incorporated in the CPU 110 and an access ratio of the program memory 114 and the data temporary storage memory 113.

As shown in the figure, as the hit ratio of the cache 111 lowers, the access ratio of the program memory 114 and the data temporary storage memory 113 increases.

Figure 21:
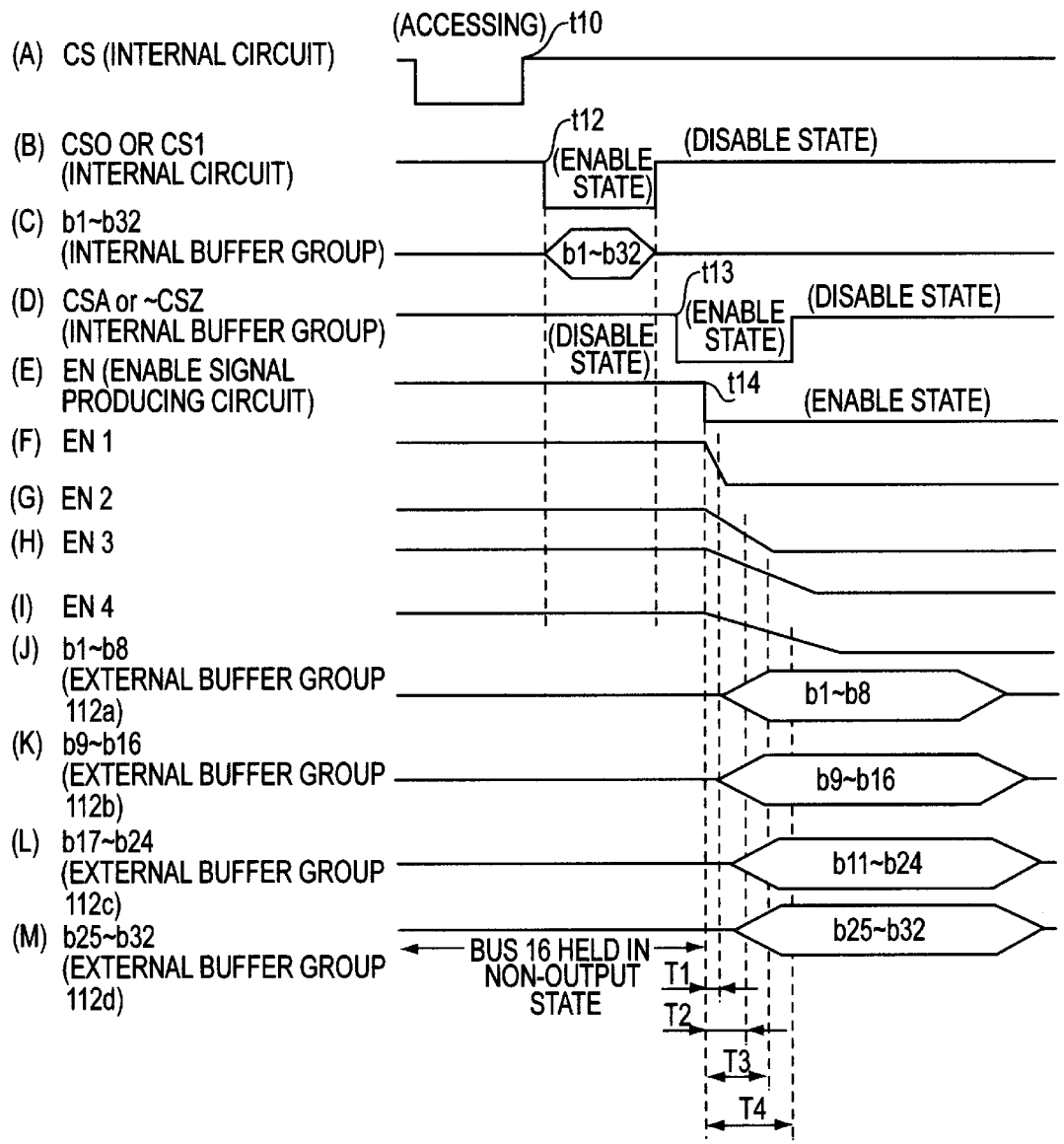
FIG. 21 is a timing chart according to the seventh preferred embodiment of the present invention.

Now, a bit signal output operation in this embodiment will be described. FIG. 21 is a timing chart achieved in this embodiment. Table 1 is a truth table showing a relationship between accessing to the exterior by the internal circuit 102 and outputting of the enable signal by the enable signal producing circuit 118.

TABLE 1

| CS0 | CS1 | CSA | - - - | CSZ | EN |
|---|---|---|---|---|---|
| 1 | * | * | - - - | * | 0 |
| * | 1 | * | - - - | * | 0 |
| 0 | 0 | 1 | - - - | * | 1 |
| 0 | 0 | * | - - - | * | 0 |
| - - - | - - - | - - - | - - - | - - - | - - - |
| 0 | 0 | * | - - - | 1 | 1 |

In Table 1, "1" represents an enable state, while "0" represents a disable state.

First, the internal circuit 102 accesses the cache 111 in the CPU 110. If judging "mishit" at time t10 shown at (A) in FIG. 21, the internal circuit 102 sets CS0 (or CS1) to an enable state at time t12 shown at (B) in FIG. 21 so as to access the program memory 114 (or data temporary storage memory 113) to read out necessary data. The read-out data is sent to the internal buffer group 103 which, as shown at (C) in FIG. 21, outputs bit signals b1 to b32.

While CS0 or CS1 is set to an enable state, the enable signal producing circuit 118 sets EN to a disable state. Therefore, the external buffer group 112 (112a to 112d) does not output bit signals b1 to b32 onto the bus 116. Accordingly, almost no current is supplied to the external buffer group 112 and no change in signal level occurs on the bus 116, i.e. the bus 116 is held in a non-output state, so that the radiant noise from the bus 116 is prevented.

On the other hand, upon accessing one of the external devices 117, the internal circuit 102 sets corresponding one of CSA to CSZ to an enable state at time t13 shown at (D) in FIG. 21. In response thereto, the enable signal producing circuit 118 sets EN to an enable state at time t14 shown at (E) in FIG. 21. EN passes through the damping resistors R1 to R4 so as to be EN1 to EN4 whose enable state timings are delayed corresponding to the resistance values r1 to r4, respectively. When EN1 to EN4 are switched from a disable state to an enable state with time delays T1 to T4, the corresponding external buffer groups 112a to 112d output bit signals b1 to b32 onto the bus 116 at the staggered output timings corresponding to the time delays T1 to T4, as shown at (F) to (M) in FIG. 21.

As described above, according to this embodiment, the memories 113 and 114 which are frequently accessed are connected between the CPU 110 and the external buffer group 112, while the other external devices 117 are connected to the output side of the external buffer groups 112. Further, when none of the external devices 117 is to be accessed, the external buffer group 112 is prohibited from outputting the bit signals, so that the bus wiring length at the output side of the external buffer group 112 can be shortened substantially. Even if the bus wiring length at the output side of the external buffer group 112 is large, the radiant noise caused by the bus wiring can be effectively suppressed by staggering the output timings of the bit signals of the external buffer group 112 using the damping resistors R1 to R4 having the mutually different resistance values r1 to r4.

Further, since the output timings of the bit signals of the external buffer group 112 are staggered using the damping resistors R1 to R4, the instantaneous maximum magnitudes of the current supplied to the external buffer group 112 can be lowered like in the sixth preferred embodiment. Thus, the radiant noise from the external buffer group 112 can be suppressed.

In the foregoing sixth and seventh preferred embodiments, the damping resistors R1 to R4 may be replaced with capacitors having mutually different capacitance's or delay circuits providing mutually different time delays.

In the foregoing first to seventh preferred embodiments, 32 buffers are put into four groups each including 8 buffers. However, the number of the groups is not limited to four, and further, the number of the buffers or bits is not necessarily the same among the groups, and may be changed among the groups depending on necessity. For example, those buffers for less significant bit signals, which are frequently used, are put into a larger number of groups, while those buffers for more significant bit signals, which are not frequently used, are put into a less number of groups.

Further, in the foregoing first to seventh preferred embodiments, the bus width may be other than 32 bits.

While the present invention has been described in terms of the preferred embodiments, the invention is not to be limited thereto, but can be embodied in various ways without departing from the principle of the invention as defined in the appended claims.

What is claimed is:

1. A data storage system, comprising:
   a plurality of buffers, each outputting one of a plurality of one-bit signals corresponding to bit data stored therein, wherein the buffers are grouped in a plurality of buffer groups each group including at least one of the buffers, wherein the groups have mutually different output times at which the buffers thereof output the corresponding one-bit signals; and
   a control device for feeding timing signals to the buffer groups at mutually different times, each of the timing signals causing the at least one of the buffers in the corresponding buffer group to output the one-bit signals stored therein, the control device including
      a control circuit for outputting the timing signals simultaneously, and
      a plurality of time adjusting circuits for delaying the timing signals with mutually different time lags, the time adjusting circuits including respective integrating circuits that have mutually different time constants.

2. The data storage system according to claim 1, wherein each buffer is a DRAM.

3. A data storage system, comprising:
   a control device outputting an address signal and a plurality of control signals;
   a plurality of delay circuits, each delaying a corresponding one of the outputted control signals; and
   a storage device having input terminals, the storage device receiving the outputted address, receiving through the input terminals the plurality of control signals delayed to the plurality of delay circuits, and outputting data specified by the address signal in accordance with the timing of the control signals;
   wherein each of the delay circuits includes
      a corresponding one of a plurality of resistors having mutually different resistant values, and
      an input capacitance of a corresponding one of the storage device input terminals.

4. A data storage system according to claim 3, wherein the plurality of delay circuits delay the control signals with mutually different lags.

5. A data storage system according to claim 3, wherein the storage device includes an input buffer and an output buffer.

6. A data storage system according to claim 3, wherein the storage device includes output buffers, and wherein the control signals represent times when the storage device inputs the data into the output buffers.

7. A data storage system according to claim 3, wherein the storage device includes output buffers, and wherein the control signals represent times when output buffers output corresponding one-bit signals.

8. The data storage system according to claim 3, wherein the storage device includes a storage circuit in which the data is identified using a first and a second address, wherein the control signals are used for designating the first and second addresses.

9. The data storage system according to claim 3, wherein each of the delay circuits further includes a capacitor connected on parallel to the input capacitance of the corresponding input terminal.

10. A data storage system according to claim 9, wherein the time constants of the delay circuits are different from each other.

11. A data storage system, comprising:
    a control device outputting an address signal and a plurality of control signals;
    a plurality of delay circuits each delaying a corresponding one of the plurality of control signals outputted from the control device, each of the delay circuits including a buffer; and
    a storage device having input terminals, the storage device receiving the address signal outputted from the control device, receiving through the input terminals the plurality of control signals delayed to the plurality of delay circuits, and outputting data specified by the address signal in accordance with the timings of the control signals;
    wherein the buffer of each of the delay circuits electrically separates the delay circuit from an input capacitance of the input terminal of the storage device through which the storage device receives the control signal delayed by the delay circuit.

12. A data storage system, comprising:
    a control device outputting an address signal and a plurality of control signals;
    a plurality of delay circuits each delaying corresponding one of the plurality of control signals outputted from the control device, each of the delay circuits including
       a first integrating section having a first resistor and a capacitor,
       a second integrating section including a second resistor, and
       a buffer electrically separating the first and second integrating sections from each other; and
    a storage device having input terminals, the storage device receiving the address signal outputted from the control device, receiving through the input terminals the plurality of control signals delayed to the plurality of delay circuits, and outputting data specified by the address signal in accordance with the timings of the control signals;
       wherein the second integrating section of each delay circuit further includes the input capacitance of the input terminal through which the storage device receives the control signal delayed by the delay circuit.

13. A data storage system according to claim 12, wherein the second integrating section further comprises a capacitor connected in parallel to the input capacitance.

* * * * *